United States Patent
Fielder et al.

(10) Patent No.: US 9,084,049 B2
(45) Date of Patent: Jul. 14, 2015

(54) AUTOMATIC EQUALIZATION USING ADAPTIVE FREQUENCY-DOMAIN FILTERING AND DYNAMIC FAST CONVOLUTION

(75) Inventors: Louis D. Fielder, Millbrae, CA (US); David S. McGrath, Rose Bay (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 271 days.

(21) Appl. No.: 13/878,705

(22) PCT Filed: Sep. 13, 2011

(86) PCT No.: PCT/US2011/051322
§ 371 (c)(1),
(2), (4) Date: Apr. 10, 2013

(87) PCT Pub. No.: WO2012/050705
PCT Pub. Date: Apr. 19, 2012

(65) Prior Publication Data
US 2013/0208917 A1    Aug. 15, 2013

Related U.S. Application Data

(60) Provisional application No. 61/393,224, filed on Oct. 14, 2010.

(51) Int. Cl.
H03G 5/00         (2006.01)
H03B 29/00        (2006.01)
H04R 3/04         (2006.01)

(Continued)

(52) U.S. Cl.
CPC ............... *H04R 3/04* (2013.01); *H03H 17/06* (2013.01); *H04L 25/03286* (2013.01)

(58) Field of Classification Search
CPC .... H03H 17/06; H04R 3/04; H04L 25/03019; H04L 2025/0335; H04L 2025/03535; H04L 2025/03592
USPC ................................ 381/71.11, 98, 103, 150
See application file for complete search history.

(56) References Cited

U.S. PATENT DOCUMENTS

| 4,207,624 A | 6/1980 | Dentino |
| 4,807,173 A | 2/1989 | Sommen |
| 4,939,685 A | 7/1990 | Feintuch |

(Continued)

FOREIGN PATENT DOCUMENTS

| EP | 0250048 | 12/1987 |
| WO | 02/17488 | 2/2002 |
| WO | 2010/014663 | 11/2010 |

OTHER PUBLICATIONS

Walzman, B.T. et al. "Automatic Equalization Using the Discrete Frequency Domain" IEEE Transaction Inform. Theory, vol. IT-19, pp. 59-68, Jan. 1973.

(Continued)

*Primary Examiner* — Khai N Nguyen

(57) ABSTRACT

Frequency-domain techniques are used for adaptive equalization that is responsive to spectral magnitude characteristics but not sensitive to phase characteristics of system response. Signal correlation may be used to improve adaptation accuracy when significant levels of ambient sounds are present. A preferred filter implementation uses convolution-based block transforms and cross-fade windows.

20 Claims, 7 Drawing Sheets

(51) Int. Cl.
*H03H 17/06* (2006.01)
*H04L 25/03* (2006.01)

(56) References Cited

U.S. PATENT DOCUMENTS

| | | |
|---|---|---|
| 5,222,189 A | 6/1993 | Fielder |
| 6,760,451 B1 | 7/2004 | Craven |
| 6,868,162 B1 | 3/2005 | Jubien |
| 7,171,436 B2 | 1/2007 | Egelmeers |
| 7,460,675 B2 | 12/2008 | L Esperance |
| 7,480,377 B2 | 1/2009 | Bershad |
| 2003/0039352 A1 | 2/2003 | Joncour |
| 2009/0220105 A1 | 9/2009 | Bachmann |
| 2013/0083939 A1 | 4/2013 | Fellers |

OTHER PUBLICATIONS

Oppenheim, A.V. et al., "Digital Signal Processing" Englewood Cliffs, NJ: Prentice Hall, 1975, pp. 110-115 and pp. 337-361.
Bershad, N.J. et al. "Analysis of the Frequency Domain Adaptive Filter" Proc. IEEE, vol. 67, pp. 1658-1659, Dec. 1979.
Ferrara, Earl R. "Fast Implementation of LMS Adaptive Filters", IEEE Trans. Ac. Speech and Signal Proc. Vik, ASSP-28, No. 4, Aug. 1980.
Mansour, D. et al. "Unconstrained Frequency-Domain Adaptive Filter", IEEE Trans. Ac. Speech and Signal Proc. pp. 726-734, Oct. 1982.
Clark G.A. et al. "A Unified Approach to Time-and Frequency-Domain Realization of FIR Adaptive Digital Filters" IEEE Transactions on Acoustics, Speech, and Signal Processing, vol. ASSP-31, No. 5, Oct. 1983, pp. 1073-1083.
Ferrara, E.R. et al. "Frequency-Domain Adaptive Filter" in "Adaptive Filters" C.F. Cowan and P.M. Grant, Prentice-Hall, 1985, Ch. 6.
Sommen, P.C.W. et al. "On Frequency Domain Adaptive Filters Using the Overlap-add Method" 1988 IEEE International Symposium on Circuits and Systems, Proceedings.
Soo, H. et al. "Multidelay Block Frequency Domain Adaptive Filter" IEEE Transactions on Acoustics, Speech and Signal Processing, vol. 38, No. 2, Feb. 1990, pp. 373-376.
Schobben, D.W. et al. "Efficient Realization of the Block Frequency Domain Adaptive Filter" 1997 IEEE, pp. 2257-2260.
Liu, S. et al. "Transform Domain Adaptive Filter in Active Noise Control" Signal Processing, 2002 6th International Conference on Aug. 26-30, 2002, Piscataway, NJ, vol. 1, pp. 272-275.
Dentino, M. et al. "Adaptive Filtering in the Frequency Domain" Proc. of the IEEE, vol. 66, No. 12, Dec. 1978, pp. 1658-1659.

AUTOMATIC EQUALIZATION USING ADAPTIVE FREQUENCY-DOMAIN FILTERING AND DYNAMIC FAST CONVOLUTION

CROSS-REFERENCE TO RELATED APPLICATIONS

This application claims priority to U.S. Provisional Patent Application No. 61/393,224 filed 14 Oct. 2010, hereby incorporated by reference in its entirety.

TECHNICAL FIELD

The present invention pertains generally to audio signal filtering and pertains more specifically to techniques that may be used to adapt an equalization filter to have a desired frequency response.

BACKGROUND ART

Audio equalization filters are used in a variety of audio signal processing systems to modify an audio signal so that the transfer function of the system conforms to a desired frequency response. For example, an equalization filter may be used to compensate for frequency-response characteristics of electronic and acoustic components of an audio playback system so that the overall system transfer function is spectrally flat.

The frequency response of an equalization filter may be static or dynamic; however, dynamic or adaptive equalization (AEQ) filters are preferred for many applications because they can compensate for changing response characteristics of a system. Traditional AEQ filters operate by minimizing a measure of difference between two time-domain signals such as system input and output signals, and they are responsive to both magnitude and phase differences between the signals.

These traditional AEQ filters, whether static or dynamic, typically require an initial setup or calibration process to determine system response characteristics for both magnitude and phase so that the values of one or more parameters of the equalization filter can be set properly. For example, an initial setup process is typically required to determine a variety of characteristics very accurately such as equipment signal processing delays and acoustic signal propagation delays so that phase errors due to temporal misalignment can be minimized. If the initial setup process is not done properly, temporal alignment errors may cause an conventional AEQ filter to operate poorly and become unstable under certain conditions.

DISCLOSURE OF INVENTION

It is an object of the present invention to provide for an adaptive process that controls adaptation of an equalization filter in a manner that is less sensitive to temporal alignment errors between different signals.

It is another object of the present invention to provide for an adaptive equalization filter that can adapt its operational characteristics without injecting significant distortion into its filtered output signal.

These objects are achieved by implementations of the present invention as set forth below. Several adaptive processes are disclosed that are implemented by frequency-domain techniques using spectral magnitudes differences but not phase or temporal differences to drive the filter-adaptation process. These processes can adapt equalization in a system as it processes normal audio program material. No special test signals are needed. This permits adaptation of the equalization filter while it is being used for its intended purpose.

The various features of the present invention and its preferred embodiments may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. Introduction

Figure 1:
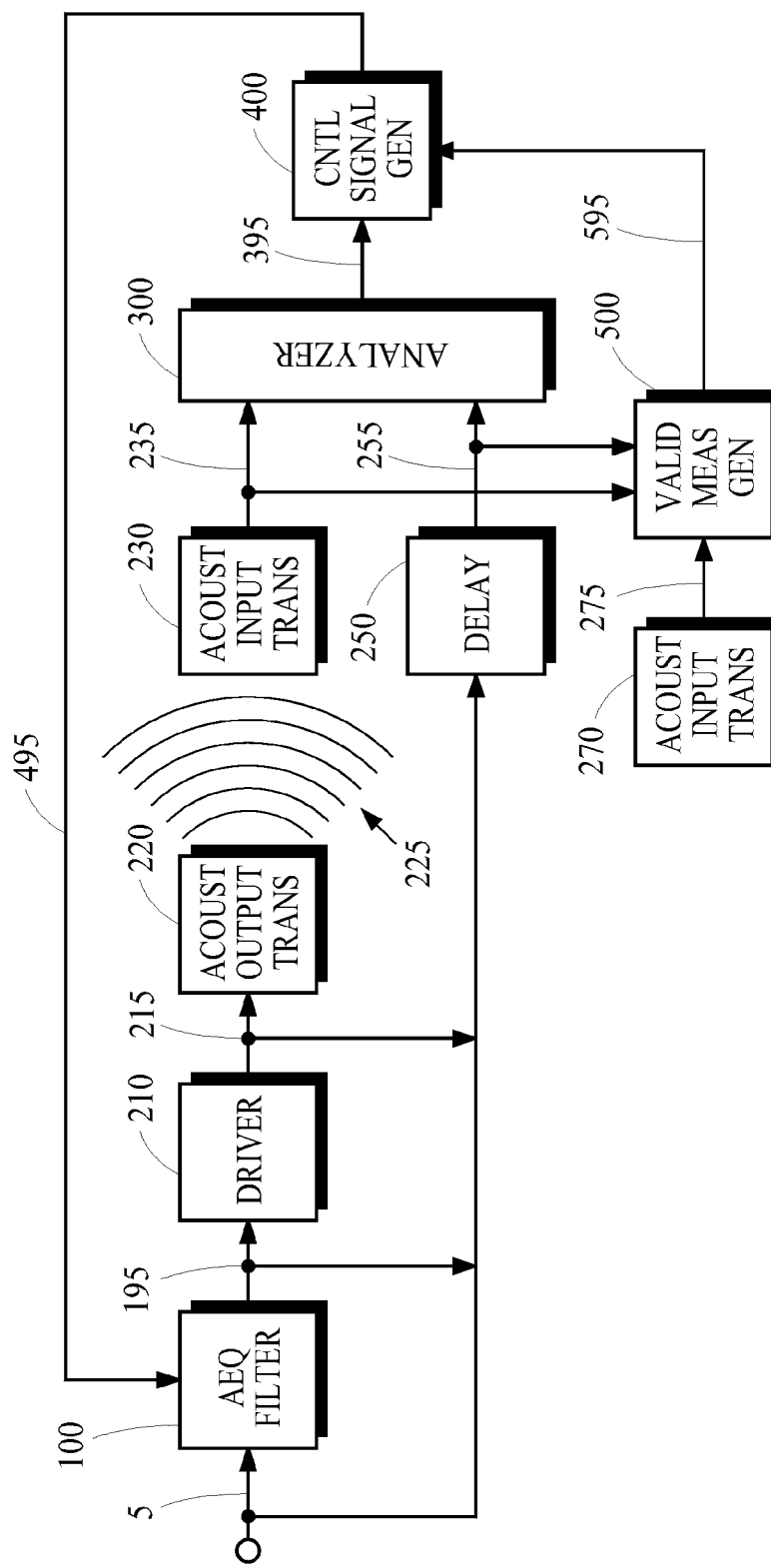
FIG. 1 is a schematic block diagram of one exemplary audio playback system that adapts the frequency response characteristics of an equalization filter.

FIG. 1 is a schematic block diagram of an audio playback system 1 that incorporates various aspects of the present invention. The diagram does not illustrate a complete system. For example, the illustration omits components like compact disc players and receivers that can provide audio signals for playback. These types of features are not needed to practice or to understand the present invention. A few alternative implementations are discussed following a general description of the system.

1. Acoustic Signal Generation

The audio playback system 1 includes an AEQ filter 100 that is applied to an audio signal 5, filters the audio signal 5 according to its current frequency response characteristics, and passes a filtered audio signal 195 to the driver 210. The AEQ filter 100 may be implemented in a wide variety of ways including the use of one or more finite impulse response (FIR) and infinite impulse response (IIR) filters that are selected or adapted to have a frequency response that is equal to or approximates a specified frequency response. Exemplary implementations are discussed below that use filterbanks implemented by frequency-domain block transforms. The filter may be applied to the entire bandwidth or only part of the bandwidth of the audio signal.

The driver 210 generates a signal in response to the filtered audio signal that is capable of driving an acoustic transducer such as a loudspeaker. The driver 210 may be an audio power amplifier, for example, and may be implemented in any way that may be desired. The driver 210 may be important in many implementations but it is not essential to practice the present invention.

The signal 215 generated by the driver 210 is passed to the acoustic output transducer 220. The acoustic output transducer 220 generates the sound field 225 in response to the signal 215. The acoustic output transducer 220 illustrated in the figure may be implemented by one or more distinct transducers, and these one or more transducers may be implemented by essentially any technology that may be desired. Essentially any type of loudspeaker or headphone transducer may be used but no particular type of output transducer is essential.

2. Signal Detection

The acoustic input transducer 230 generates a detection audio signal 235 in response to the sound field 225. The acoustic input transducer 230 illustrated in the figure may be implemented by one or more distinct transducers, and these one or more transducers may be implemented by essentially any technology that may be desired. For example, essentially any type of microphone may be used but no particular type of input transducer is essential. The acoustic input transducer 230 should be located near the location where one or more listeners are expected to be located. If the acoustic output transducer 220 is incorporated into a headphone, the acoustic input transducer 230 should be located inside any cup or acoustic shield of the headphone near the ear of a listener.

The delay 250 receives a signal from some point along the signal processing path as illustrated and generates a delayed audio signal 255 that is a delayed replica of its input signal. The delayed audio signal 255 is aligned in time with the corresponding detection audio signal 235. The amount of delay needed to obtain proper alignment is establishing during an initial setup of the system. The present invention is usually able to achieve very good results for larger errors in alignment than is possible using conventional methods. The delay 250 may be implemented in any way that may be desired but it is anticipated that digital implementations will be preferred for many applications.

If the delay 250 receives the audio signal 5 as its input, for example, the amount of delay imposed by the delay 250 is set approximately equal to the total signal processing and propagation delay from the input to the AEQ filter 100 to the output of the acoustic input transducer 230. In many implementations, this total delay is approximately equal to a sum of the signal processing delay through the AEQ filter 100, the sound field 225 propagation delay from the acoustic output transducer 220 to the acoustic input transducer 230, and the processing delays for analog-to-digital conversion and buffering. The control method used for this implementation is referred to below as the "feedback method" and allows the filter control system to adapt the frequency response characteristics of the AEQ filter 100 with that filter within a control loop.

If the delay 250 receives the filtered audio signal 195 as its input, the amount of delay imposed by the delay 250 is set approximately equal to a sum of the total signal processing and propagation delay from the input to the driver 210 to the output of the acoustic input transducer 230 and the processing delays for analog-to-digital conversion and buffering. In many implementations, this total delay is approximately equal to the sound field 225 propagation delay from the acoustic output transducer 220 to the acoustic input transducer 230. The control method used for this implementation is referred to below as the "non-feedback method" and adapts the frequency response characteristics of the AEQ filter 100 with that filter outside the control loop. A similar situation exists if the delay 250 receives the signal 215 as its input.

3. Signal Analysis and Control Signal Generation

The analyzer 300 receives the detection audio signal 235 and the delayed audio signal 255, obtains frequency-domain representations of the two signals, obtains a frequency-domain representation of a system target response 380, and processes these three representations to generate an estimated spectral magnitude response correction signal 395. In one implementation, a system transfer function 375 is derived from the frequency-domain representations of the detection audio signal 235 and the delayed audio signal 255, and the estimated spectral magnitude response correction signal 395 is generated by comparing this transfer function 375 to the system target response 380. Details of a few implementations are described below.

The control-signal generator 400 generates an equalization-filter control signal 495 in response to the estimated spectral magnitude response correction signal 395. The equalization-filter control signal 495 may be identical to or derived directly from the estimated spectral magnitude response correction signal 395; however, in preferred implementations, the equalization-filter control signal 495 is generated by applying a smoothing filter to a sequence of estimated spectral magnitude response correction signals 395 received from the analyzer 300.

The AEQ filter 100 adapts its frequency response characteristics in response to the equalization-filter control signal 495.

4. Signal Validation

The validity-measure generator 500 is optional and may be used to improve AEQ filter adaptation in noisy environments. The acoustic input transducer 270 should be located in a position where it can generate a second detection audio signal 275 in response to any ambient sounds that may be present. The acoustic input transducer 270 may be implemented by one or more distinct transducers, and these transducers may be implemented by essentially any technology that may be desired. Essentially any type of microphone may be used. No particular type of input transducer is essential.

If the acoustic output transducer 220 is incorporated into a headphone, the second acoustic input transducer 270 should be located outside any cup or acoustic shield of the headphone away from the ear of a listener.

The validity-measure generator 500 compares signal levels or spectral characteristics of the second detection audio signal 275, the detection audio signal 235 and the delayed audio signal 255 and generates measures of validity 595 that are associated with components of the estimated spectral magnitude response correction signal 395.

Higher levels of ambient sounds generally produce greater differences between the second detection audio signal 275, the detection audio signal 235 and delayed audio signals 255.

Spectral components that have greater differences generally indicate those spectral components of the detection audio signal are less reliable indicators of true system performance. The control-signal generator 400 may modify magnitudes of one or more components of the estimated spectral magnitude response correction signal 395 in response to the associated measures of validity 595 so that adaptation of the AEQ filter 100 is less responsive to those components that are deemed to be less reliable.

B. Exemplary Implementations

Four exemplary implementations are described below. These implementations use one of two control methods referred to as feedback and non-feedback methods, and each of these methods can be used with an analysis of either spectral magnitudes or average correlation scores of spectral magnitudes.

In each of these four exemplary implementations, several components of the audio playback system 1 including the AEQ filter 100 and the analyzer 300 use filterbanks to obtain frequency-domain representations of signals. For example, the analyzer 300 uses filterbanks to obtain frequency-domain representations of the detection audio signal 235 and the delayed audio signal 255. These filterbanks may be implemented in essentially any way that may be desired that covers the frequency range of interest. For example, the filterbanks may be implementations of the Discrete Fourier Transform (DFT) and Inverse Discrete Fourier Transform (IDFT), the Modified Discrete Fourier Transform (MDFT) and Inverse Modified Discrete Fourier Transform (IMDFT), the Discrete Cosine Transform (DCT) and Inverse Discrete Cosine Transform (IDCT), the Quadrature Minor Filter (QMF), and the Complex Quadrature Mirror Filter (CQMF) using direct or alternative computational methods such as the Fast Fourier Transform (FFT). References to FFT and IFFT in the following examples indicate use of the FFT computational methods for implementations of DFT filterbanks.

1. Feedback with Magnitude Comparison

In the first exemplary implementation, the delay 250 receives its input signal from a signal path prior to the AEQ filter 100. The amount of lag or delay imposed by the delay 250 is set so that corresponding intervals of the delayed audio signal and the detection audio signal are aligned in time when they are input to the analyzer 300.

a) Signal Analysis

The analyzer 300 processes a frequency-domain representation of a block or segment of the delayed audio signal 255, a frequency-domain representation of a block or segment of the detection audio signal 235, and a frequency-domain representation of a system target response 380 to generate an estimated spectral magnitude response correction signal 395. This estimated correction signal 395 represents the change in frequency response of the AEQ filter 100 that is required for the audio playback system 1 to achieve an overall frequency response that matches the system target response 380.

One way that this may be done is by deriving a system transfer function 375 from a comparison of the spectral magnitudes in a block or segment of the delayed audio signal 255 with the spectral magnitudes in a corresponding block or segment of the detection audio signal 235, and then deriving an estimated correction signal 395 from a comparison of the system transfer function 375 to the system target response 380.

(1) Frequency-Domain Representations

Figure 2:
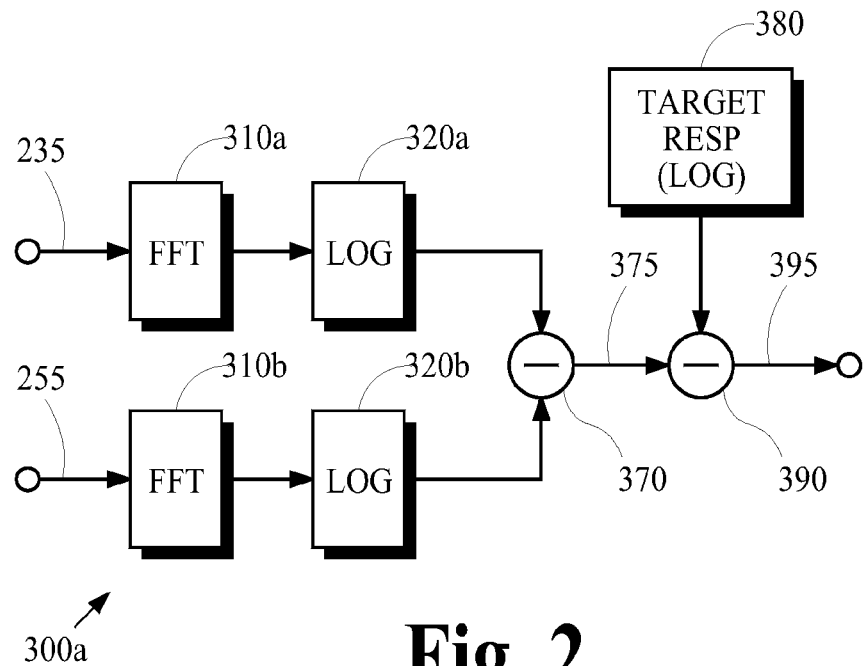
FIGS. 2 and 3 are schematic block diagrams of exemplary implementations of the analyzer in the system of FIG. 1.

One implementation of the analyzer 300 illustrated in FIG. 2 performs its analysis on a block-by-block basis. The filterbank 310a is implemented by an FFT that generates a block of complex-valued transform coefficients constituting a frequency-domain representation of the detection audio signal 235. The log calculator 320a converts the complex values of these transform coefficients into logarithms of their magnitudes to facilitate subsequent calculations.

The operations of the filterbank apply an analysis window function to a sequence of overlapping blocks of signal samples and then apply a transform to the blocks of windowed samples to generate blocks of transform coefficients. For example, the filterbank may be applied to overlapping signal sample blocks that are N=128 samples in length, overlap one another by N/2 samples, where the signal sample rate is 8 kHz. All or only some of the transform coefficients in each block may be analyzed and used to adapt the AEQ filter 100.

A suitable analysis window function WA is shown in expression 1.

$$WA(n) = \begin{cases} W^{\frac{N}{2}}_{Kaiser, \alpha=1}(n) & \text{for } 0 \leq n < \frac{N}{4} \\ 1 & \text{for } \frac{N}{4} \leq n < \frac{3N}{4} \\ W^{\frac{N}{2}}_{Kaiser, \alpha=1}\left(n - \frac{N}{2}\right) & \text{for } \frac{3N}{4} \leq n < N \end{cases} \quad (1)$$

where N=length of the block of samples;

$$W^{\frac{N}{2}}_{Kaiser, \alpha=1}(n) = \frac{I_0\left[\pi\alpha\sqrt{1.0 - \left(\frac{n - \frac{N-2}{4}}{\frac{N-2}{4}}\right)^2}\right]}{I_0[\pi\alpha]} \quad \text{for } 0 \leq n < \frac{N}{2}$$

and $\alpha = 1$; and $$I_0(x) = \sum_{k=0}^{\infty} \frac{\left(\frac{x}{2}\right)^k}{k!}$$

Empirical tests have shown this particular analysis window function provides good frequency selectivity and reduction of block-boundary artifacts; however, any analysis window function can be used.

The FFT used in this implementation generates a block of transform coefficient pairs according to the following expression:

$$X(k) = \sum_{n=0}^{N-1} x(n) \cdot e^{\frac{-2\pi jkn}{N}} \quad \text{for } 0 \leq k < N \quad (2a)$$

where x(n)=input signal sample n;

$j=\sqrt{-1}$; and

X(k)=transform coefficient for spectral component k.

The complementary Inverse Fast Fourier Transform (IFFT) discussed below generates a block of time-domain signal samples according to the following expression:

$$x(n) = \frac{1}{N} \sum_{k=0}^{N-1} X(k) \cdot e^{\frac{2\pi jkn}{N}} \text{ for } 0 \le n < N. \quad (2b)$$

The first N/2−1 complex coefficient pairs plus the coefficients at the zero and Nyquist frequencies are unique. The log calculator 320a generates a logarithmic representation of spectral magnitude by calculating the magnitude of each transform coefficient or complex pair and then obtaining the logarithm of the magnitudes. As note above, this conversion to a log domain is done to improve efficiency of some arithmetic calculations. Alternatively, calculations with spectral magnitudes in a linear domain may be used.

The filterbank 310b implemented by an FFT generates a block of complex-valued transform coefficients constituting a frequency-domain representation of the delayed audio signal 255. The log calculator 320b converts the complex values of these transform coefficients into logarithms of their magnitudes. The filterbank 310b and the log calculator 320b are implemented in the same way as the filterbank 310a and the log calculator 320a, respectively.

(2) System Transfer Function

The subtractor 370 subtracts the logarithmic values of the transform coefficients received from the log calculator 320b from the logarithmic values of the transform coefficients received from the log calculator 320a. This provides a representation of the system transfer function 375 in the log domain. Conceptually, the subtractor 370 obtains a logarithmic representation of the system transfer function 375 by calculations that may expressed as:

$$T_{log}(k) = \left(\frac{S_A(k)}{S_D(k)}\right) \text{ for } 0 \le k \le \frac{N}{2} \quad (3)$$

where
$S_A(k)$=magnitude of transform coefficient k for the detected audio signal;
$S_D(k)$=magnitude of transform coefficient k for the delayed audio signal; and
$T_{log}(k)$=system transfer function in the log domain.

(3) Estimated Response Correction Signal

The system component represented by the system target response 380 in the figure provides a representation of the desired system frequency response or the system target response 380 in the log domain. The subtractor 390 subtracts the log values of the system transfer function 375 from the log values of the system target response 380 to obtain an estimated spectral magnitude response correction signal 395. The magnitude of the components of the estimated correction signal 395 are expressed in the log domain. Conceptually, the subtractor 390 obtains a logarithmic representation of spectral magnitudes of the estimated spectral magnitude response correction signal 395 by calculations that may be expressed as:

$$C_{log}(k) = \log\left(\frac{TGT(k)}{T(k)}\right) \text{ for } 0 \le k \le \frac{N}{2} \quad (4)$$

where
TGT(k)=audio playback system target response;
T(k)=system transform function in the linear domain; and
$C_{log}(k)$=log magnitude of coefficient k for the estimated correction signal.

The estimated spectral magnitude response correction signal 395 is passed to the control-signal generator 400. This correction signal is accurate over long time intervals but it can vary significantly from block to block due to variations in the audio signal 5, variations in ambient sounds, and variations in stochastic noise sources within the system itself. As a result, the component values in the estimated correction signal 395 for any given block may differ significantly from the corrective values that should be provided to the AEQ filter 100. Preferably, a smoothing filter is applied to the estimated correction signal 395 to reduce or eliminate spurious variations that might otherwise cause adaptations of the AEQ filter 100 to generate audible artifacts. Smoothing is optional. In the exemplary implementations disclosed below, a smoothing filter is applied in the control-signal generator 400.

b) Control Signal Generation

The control-signal generator 400 generates the equalization-filter control signal 495 that controls adaptation of the AEQ filter 100. In preferred implementations as mentioned above, the control-signal generator 400 derives the equalization-filter control signal 495 by applying a smoothing filter to the estimated correction signal 395 to reduce system sensitivity to noise. The control-signal generator 400 may also modify the values of selected components of the estimated correction signal 395 under conditions where the values of the selected components are deemed to be unreliable or invalid.

(1) Component Smoothing

If block transforms are used to implement the filterbanks 310a, 310b, the system transfer function 375 and the estimated spectral magnitude response correction signal 395 are each represented by values arranged in a series of blocks. Abrupt changes in the values may occur from block to block. Temporal smoothing or low pass filtering of the components that constitute the equalization-filter control signal 495 can be used to eliminate abrupt changes in the frequency response of the AEQ filter 100 that might otherwise generate audible artifacts.

Figure 6:
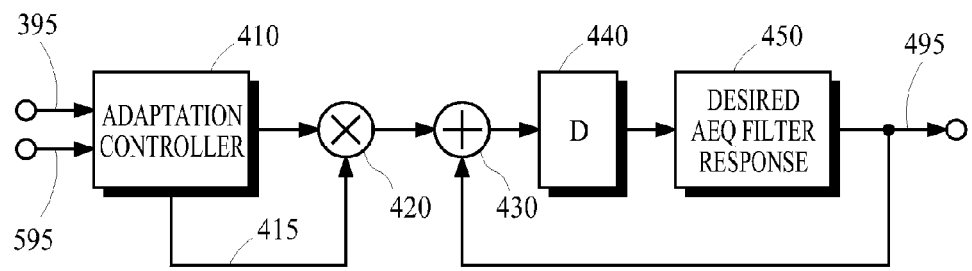
FIGS. 6 and 7 are schematic block diagrams of exemplary implementations of the control-signal generator in the system of FIG. 1.

FIG. 6 illustrates one suitable implementation that includes a first-order smoothing function in the form of a leaky corrector. Empirical tests have shown that a first order filter is adequate for many applications but higher order smoothing filters may be used if desired. In the implementation shown in FIG. 6, the adaptation controller 410 generates a leak factor vector 415 and the vector multiplier 420 attenuates the magnitudes of the components in the estimated spectral magnitude response correction signal 395 according to the respective factors in the leak factor vector 415. The vector adder 430 combines the attenuated components in the estimated spectral magnitude response correction signal 395 with corresponding components in the current desired AEQ filter response 450. This sum is delayed in the delay 440 by the block overlap interval, which is equal to N/2 signal sample intervals, and then stored to become the current desired AEQ filter response 450.

The desired AEQ filter response 450 may be initialized at system startup by values that were established during system design or may be restored to the most recent desired response that was current when the system was shutdown.

The leak factor vector 415 may comprise factors with fixed values. If the leak factor vector 415 comprises factors with fixed values, these values may be chosen to provide a desired rate of adaptation of the AEQ filter 100. Empirical tests have shown that a suitable rate for many applications allows the AEQ filter 100 to converge within about 2 dB of the desired response over an interval of about one second with other factors in the audio playback system 1 held constant. A leak factor of about 0.01 provides this rate of convergence if the blocks are N=128 samples in length with an overlap of N/2 samples and a sample rate of 8 kHz.

(2) Component Modification

Alternatively, the factors in the leak factor vector 415 may be adapted in response to signals that indicate the validity or reliability of the components in the estimated spectral magnitude response correction signal 395. One or more of these components may not be a reliable indication of what response correction is needed if high-level ambient sounds or noise from any other source are present and detected by the acoustic input transducer 230. The influence that a particular component of the estimated correction signal 395 has on the equalization-filter control signal 495 may be reduced or even eliminated if that component is deemed to be unreliable.

Preferred implementations assess the reliability of the components of the estimated correction signal 395 and use this assessment to control how the estimated correction signal 395 is used to adapt the AEQ filter 100. One way that this may be done is to use the acoustic input transducer 270 and the validity-measure generator 500 as shown in FIG. 1 to generate the measures of validity 595 and to have the adaptation controller 410 modify, replace or attenuate the influence of respective components of the estimated correction signal 395 in response to these measures. This approach is described below.

c) Validity Measure Generation

Figure 4:
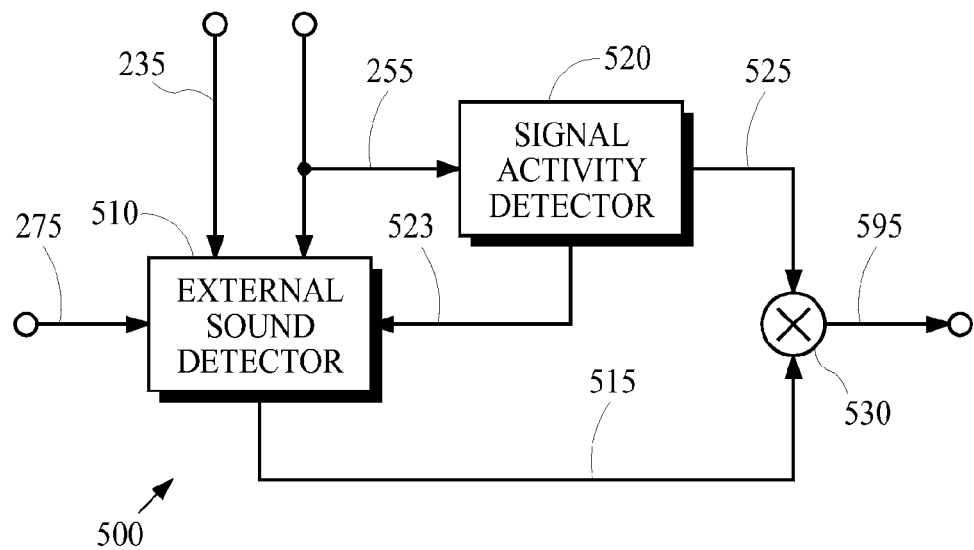
FIG. 4 is a schematic block diagram of an exemplary implementation of the validity-measure generator in the system of FIG. 1.

One implementation of the validity-measure generator 500 is shown in FIG. 4. In this implementation, the signal activity detector 520 analyzes the delayed audio signal 255 and generates a set of values 525 that indicate whether significant spectral components are present in the delayed audio signal 255. This may be done by generating binary values that indicate whether spectral magnitudes of the delayed audio signal 255 exceed thresholds. Measures of signal level 523 derived from the spectral magnitudes is passed to the external sound detector 510. These measures of signal level 523 may be the spectral magnitudes themselves.

The magnitudes of spectral components may be obtained by calculating the magnitudes of the transform coefficients generated by the filterbank 310b in the analyzer 300. The magnitude of each transform coefficient is compared to a respective threshold that represents a frequency-dependent level at which a spectral component is deemed large enough to allow reliable calculations of system response characteristics. This process may be expressed as:

$$V_D(k) = \begin{cases} 1 & X_{D,log}(k) > Th(k) \\ 0 & X_{D,log}(k) \leq Th(k) \end{cases} \quad (4)$$

where $V_D(k)=1$ indicates a significant transform coefficient k in delayed audio signal;

$X_{D,log}(k)$=log magnitude of transform coefficient k in the delayed audio signal; and $Th(k)$=threshold level for transform coefficient k.

The external sound detector 510 determines whether spectral components of ambient sounds have magnitudes that are too low to distort the estimated spectral magnitude response correction signal. This may be done by comparing transform coefficient magnitudes of the detection audio signal 235 with adjusted transform coefficient magnitudes of the second detection audio signal 275. The transform coefficient magnitudes of the second detection audio signal 275 are adjusted by an attenuation factor representing the degree of isolation between sounds in the acoustic channel through which the sound field 225 propagates and sounds outside this acoustic channel. The degree of isolation is estimated during design or setup of the system. The external sound detector 510 generates a set of values 515 that indicate whether the values of transform coefficients of the detected audio signal are essentially immune to any ambient sounds that are present. This process may be expressed as:

$$V_E(k) = \begin{cases} 1 & X_{A,log}(k) > (X_{E,log}(k) - X_{I,log}(k)) \\ 0 & X_{A,log}(k) \leq (X_{E,log}(k) - X_{I,log}(k)) \end{cases} \quad (5)$$

where $V_E(k)=1$ indicates transform coefficient k of the detected audio signal is immune to ambient sounds;

$X_{A,log}(k)$=log magnitude of transform coefficient k in the detected audio signal;

$X_{E,log}(k)$=log magnitude of transform coefficient k in second detected audio signal; and $X_{I,log}(k)$=log magnitude of acoustic channel isolation for transform coefficient k.

The vector multiplier 530 multiplies the sets of values 515 and 525 and generates measures of validity 595 that indicate which components of the estimated spectral magnitude response correction signal 395 are deemed to be invalid or unreliable. In this particular implementation, these measures comprise N/2+1 binary-valued elements where zero indicates a respective component is not reliable.

(1) Alternative Process

Measures of validity that are derived from the second detection audio signal 275 and the magnitudes of acoustic isolation as discussed above can be replaced or augmented by measures derived from an estimated acoustic error signal. The estimated acoustic error signal can be obtained from a difference between corresponding spectral components of the detection audio signal 235 and the delayed audio signal 255.

If the system target response 380 is not spectrally flat, the accuracy of the estimated acoustic error signal can be improved if the audio signal that is either passed into or received from the delay 250 is equalized by a minimum-phase filter having the target response. This works well if the overall transfer function of the acoustic output transducer 220, the acoustic channel through which the sound field 225 propagates, and the acoustic input transducer 230 can be represented accurately by a minimum phase filter with a possible time delay. When these conditions present, the filtering effects of the AEQ filter 100 make the detection audio signal 235 substantially equal to the delayed audio signal 255 plus any ambient sounds that are detected by the acoustic input transducer 230.

(2) Correction Signal Component Modification

In preferred implementations, the adaptation controller 410 in the control-signal generator 400 responds to the measures of validity 595 by doing either one or both of modifying components of the estimated spectral magnitude response correction signal 395 or adapting the leak factor vector 415. The intention of these modifications is to eliminate or reduce the influence of ambient sounds and other noise on the adaptation of the AEQ filter 100. This may be done in a variety of ways. A few examples are described below.

The processes described below refer to bands that contain multiple components. These processes may also be used in implementations where the bands contain all the components for the estimated spectral magnitude response correction signal 395 or where a band contains only one component. The following examples use the set of binary valued measures of validity 595 described above in which a value of one indicates a respective component of the estimated spectral magnitude response correction signal 395 is reliable and in which a value of zero indicates the component is not reliable.

In one process, the adaptation controller 410 inhibits adaptation of the AEQ filter 100 for a particular band if the measures of validity 595 indicate a majority of the components in the band are unreliable. This may be done in either of two ways.

For the first way, the adaptation controller 410 continues passing the same control values for all components in that band until the measures of validity 595 indicate at least a majority of the components are reliable. When adaptation is allowed for the band, the adaptation controller 410 passes the new component values and the smoothing filter in the control-signal generator 400 generates a sequence of equalization-filter control signals 495 with control values for the band that smoothly change from the old values to the desired new values. This technique is sometimes referred to as a time-based zero-order hold. Alternatively, the hold can be triggered in response to the measures of validity 595 indicating all components in a band are unreliable, or indicating one or more components in the band are unreliable.

For the second way, the adaptation controller 410 sets the appropriate factors in the leak factor vector 415 to zero. When adaptation is allowed for the band, the adaptation controller 410 sets the appropriate factors to their customary non-zero values.

In another process, the adaptation controller 410 generates substitute values for unreliable components. This may be done in several ways. One way obtains substitute values by interpolating between values of reliable components. The interpolation is done across frequency and may be done using a first-order or linear interpolation between two reliable components or using a higher-order interpolation between a larger number of components. Another way obtains the substitute value from the nearest component that is reliable. This way is useful for components at band edges when interpolation is not possible.

As an alternative to interpolation and substitution of unreliable components, the value of unreliable components may be modified to limit the variation between adjacent components in the frequency domain. This approach can be effective because errors can manifest themselves as significant localized deviations while any practical desired equalization has limited variations between adjacent components.

This limitation on component-to-component variation can vary as a function of frequency or be constant. Suitable limits may be determined empirically by deriving system transfer functions 375 for a variety of listening environments and identifying the maximum component-to-component variation within all of the system transfer functions 375.

2. Feedback with Correlation Comparison

The second exemplary implementation is similar to the first implementation described above. The differences in implementation arise from what is analyzed in the analyzer 300. The second exemplary implementation is preferred for many applications because it is generally less sensitive to noise.

a) Signal Analysis

Figure 3:
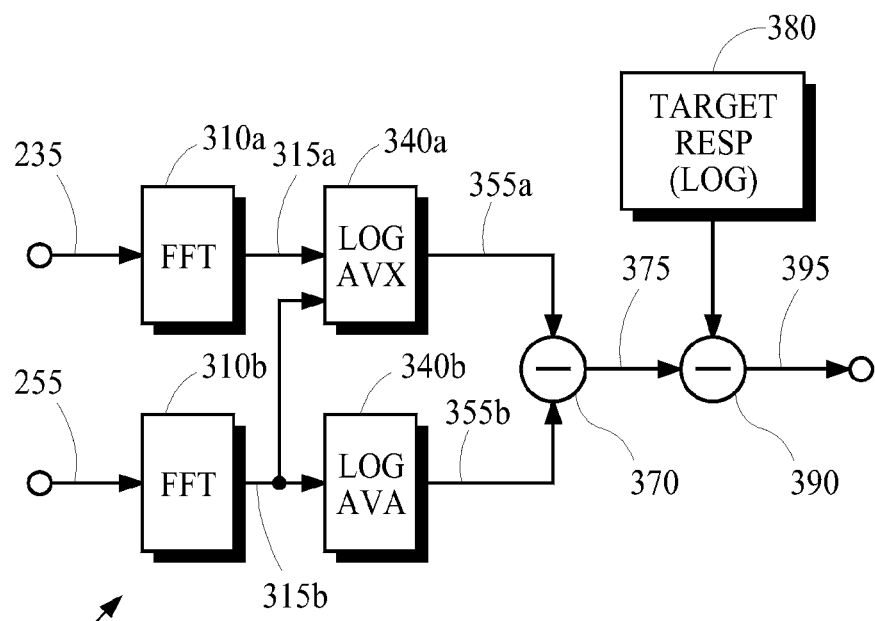

The analyzer 300 for this implementation performs substantially the same processes as those described above but, instead of comparing magnitudes of spectral components to derive the system transfer function 375, it compares averages of cross correlation and autocorrelation scores for those spectral components. One implementation of the analyzer 300 is illustrated in FIG. 3. The following paragraphs describe differences with the implementation described above that is illustrated in FIG. 2.

The log average cross correlation (LOG AVX) calculator 340a receives a block 315a of transform coefficients for the detection audio signal 235 from the filterbank 310a, receives a block 315b of transform coefficients for the delayed audio signal 255 from the filterbank 310b, calculates cross correlation scores for the transform coefficients in these two blocks, calculates an average for a series of the correlation scores using a leaky integrator, and obtains a logarithmic representation 355a of the averages. As noted above, conversion to a log domain is done to improve efficiency of some arithmetic calculations. Alternatively, these calculations as well as other calculations may be done in a linear domain.

The log average autocorrelation (LOG AVA) calculator 340b receives a block 315b of transform coefficients for the delayed audio signal 255 from the filterbank 310b, calculates autocorrelation scores for the transform coefficients in this block, calculates an average for a series of the autocorrelation scores using a leaky integrator, and obtains a logarithmic representation 355b of the averages.

Figure 5:
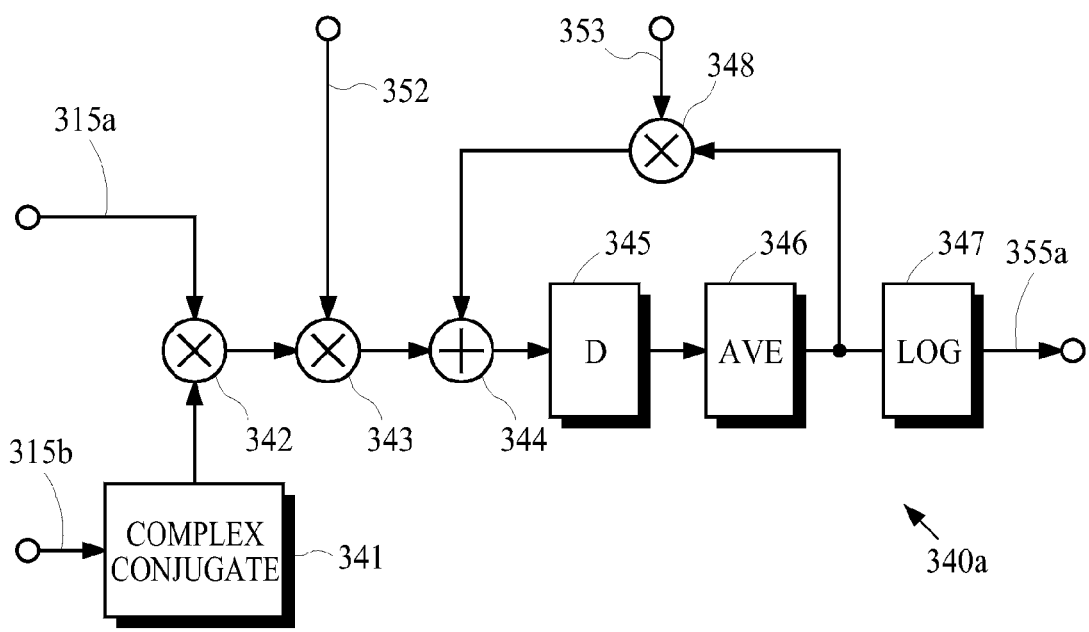
FIG. 5 is a schematic block diagram of an exemplary implementation for the log average cross correlation calculator and the log average autocorrelation calculator in the analyzer of FIG. 3.

An exemplary implementation for the LOG AVX calculator 340a is shown in FIG. 5. The complex conjugate component 341 obtains the complex conjugate of each transform coefficient in a block 315b of transform coefficients for the delayed audio signal 255 received from the filterbank 310b and passes this result to the vector multiplier 342. The vector multiplier 342 also receives from the filterbank 310a a block 315a of transform coefficients for the detection audio signal 235 as its second input and calculates a block of cross correlation scores for its two inputs. The block of correlation scores is passed to the vector multiplier 343, which attenuates each score in the block in response to respective factors in a first correlation leak factor vector 352. The block of attenuated correlation scores is added to an attenuated block of average correlation scores received from the vector multiplier 348, and the resulting sum is passed to the delay 345, which imposes a one-sample delay on the block. The delayed block of scores then becomes the new average of block correlation scores 346, which is passed to the vector multiplier 348 and to the log calculator 347. The vector multiplier 348 attenuates each score in the block of average correlation scores in response to respective factors in a second correlation leak factor vector 353. The log calculator 347 calculates the logarithmic representation 355a of each score in the block of average correlation scores.

The vector multiplier 343 and the vector multiplier 348 implement a conventional first-order low pass filters in which the factors in the two correlation leak factor vectors are related to each other as follows:

$$f_2(k) = (1 - f_1(k)) \quad (6)$$

where
$f_1(k)$=factor for transform coefficient k in first correlation leak factor vector; and
$f_2(k)$=factor for transform coefficient k in second correlation leak factor vector.

Convergence in adaptation may be improved by setting each $f_1(k)$ at least two times larger than the corresponding component of the leak factor vector 415. Smaller values of $f_1(k)$ result in adaptation overshoots and/or ringing.

The operations described above for calculating the cross correlation scores for a pair of blocks of the detection audio signal 235 and the delayed audio signal 255 may be expressed as:

$$xcorr(k \cdot m) = X_A(k,m) \cdot X^*_D(k,m) \quad (7)$$

where
$X^*_D(k,m)$=complex conjugate of transform coefficient k in block m of the delayed audio signal;
$X_A(k,m)$=transform coefficient k in block m of the detected audio signal; and
xcorr(k,m)=cross correlation score for component k for blocks m.

The average of the cross correlation scores is calculated according to the following:

$$avexcorr(k, m+1) = xcorr(k, m+1) \cdot f_1(k) + \quad (8)$$
$$avexcorr(k, m) \cdot f_2(k)$$
$$= xcorr(k, m+1) \cdot f_1(k) +$$
$$avexcorr(k, m) \cdot [1 - f_1(k)]$$

where avexcorr(k,m)=average cross correlation score for component k for blocks m.

The LOG AVA calculator 340b is also implemented as shown in FIG. 5 and operates the same as the LOG AVX calculator 340a except for the differences described here. Both of the LOG AVA calculator's inputs receive the same block 315b of transform coefficients for the delayed audio signal 255 from the filterbank 310b. The vector multiplier 342 calculates a block of autocorrelation scores for the block of transform coefficients.

The operations described above for calculating the auto correlation scores for a block of the delayed audio signal 255 may be expressed as:

$$acorr(k \cdot m) = X_D(k,m) \cdot X^*_D(k,m) \quad (9)$$

where
$X_D(k,m)$=transform coefficient k in block m of the delayed audio signal; and
acorr(k,m)=auto correlation score for component k for block m.

The average of the auto correlation scores is calculated according to the following:

$$aveacorr(k, m+1) = acorr(k, m+1) \cdot f_1(k) + \quad (10)$$
$$aveacorr(k, m) \cdot f_2(k)$$
$$= acorr(k, m+1) \cdot f_1(k) +$$
$$aveacorr(k, m) \cdot [1 - f_1(k)]$$

where aveacorr(k,m)=average auto correlation score for component k for block m.

The factors in the first and second correlation leak factor vectors may comprise factors with fixed values. If these vectors comprise factors with fixed values, these values affect the rate of adaptation of the AEQ filter 100. Empirical tests have shown that a suitable rate for many applications allows the AEQ filter 100 to converge within about 2 dB of the desired response over an interval of about one second. A factor of about 0.01 in the first correlation leak factor vector provides this rate of convergence if the blocks are N=128 samples in length with an overlap of N/2 samples and a sample rate of 8 kHz.

The factors in the first and second correlation leak factor vectors may also be adapted. Preferably, the factors are adapted in response to values that represent the amount of noise that is present in the detection audio signal 235 such that the factor in the first correlation leak factor vector are smaller when more noise is present. If desired, these factors may be adapted in response to the measures of validity 595 by setting the factor in the first vector for transform k to zero when the corresponding measure of validity 595 for the transform k indicates it is not reliable. The factors in the second correlation leak factor vector are adapted according to expression 6.

The subtractor 370 subtracts the logarithmic values of the auto correlation scores received from the LOG AVA calculator 340b from the logarithmic values of the cross correlation scores received from the LOG AVX calculator 340a. This provides a representation of the system transfer function 375 in the log domain. Conceptually, the subtractor 370 obtains a logarithmic representation of the system transfer function 375 by calculations that may expressed as:

$$T_{log}(k, m) = \log\left(\frac{avexcorr(k, m)}{aveacorr(k, m)}\right) \text{ for } 0 \le k \le \frac{N}{2} \quad (11)$$

where $T_{log}(k,m)$=system transfer function in the log domain for blocks m.

The subtractor 390 subtracts the log values of the system transfer function 375 from the log values of the system target response 380 to obtain an estimated spectral magnitude response correction signal 395 as discussed above.

A further improvement in tradeoff between adaptation convergence and reduced sensitivity to noise can be obtained by varying the correlation leak factor vector 415 in response to the ratio of the levels of ambient sounds to the desired levels in the detection audio signal 235. When the ambient-to-desired sound level ratio exceeds a certain threshold, each component in the first correlation leak factor vector 352 is reduced from a nominal correlation leak factor value. This ratio is calculated for each transform coefficient k in the log domain from the difference between the average log magnitude of transform coefficient k for the detection audio signal 235 and its expected log magnitude. The expected log magnitude may be derived from the log magnitude of transform coefficient k for the delayed audio signal 255, the previously estimated system transfer function 375, and the system target response 380.

One implementation of this process is shown in the following equations:

$$f_1(k) = \begin{cases} nomcorrleak & \text{for } f_{1var}(k) > nomcorrleak \\ f_{1var}(k) & \text{for } f_{1var}(k) \leq nomcorrleak \end{cases} \quad (12)$$

where nomcorrleak=nominal value for the correlation leak factor;

$$f_{1var}(k) = 10^{\left[\frac{2(T_{log}(k,m-1)) + X_{D,log,ave}^2(k) - 2(TGT_{log}(k)) - X_{A,log,ave}^2(k) - const}{10}\right]};$$

$TGT_{log}(k)$=log value of component k in the system target response;
$X_{A,log,ave}^2(k)$=log average of detection audio signal autocorrelation scores for component k;
$X_{D,log,ave}^2(k)$=log average of delayed audio signal autocorrelation scores for component k; and
const=an empirically-derived constant.

The log average autocorrelation scores for the component k of the delayed audio signal 255 may be obtained from the logarithmic representation 355b of averages generated by the LOG AVA calculator 340b. The log average autocorrelation scores for the component k of the detection audio signal 235 may be obtained from an additional LOG AVA calculator that is applied to blocks 315a of transform coefficients for the detection audio signal 235 received from the filterbank 310a.

Empirical studies have shown that a suitable value for the nominal correlation leak factor nomcorrleak for many applications is about two times the fixed value leak factor discussed above. A suitable value for nomcorrleak is 0.02 for blocks of N=128 samples overlapping one another by N/2 samples at a sample rate of 8 kHz.

The value for const is typically in the range from 0 to 10 dB and may be adjusted empirically to obtain a desired level of AEQ filter adaptation accuracy even with significant levels of ambient sound. A larger value for const causes the averaging process to calculate averages over longer periods of time, which should reduce sensitivity to ambient sounds and increase adaptation accuracy.

b) Validity Measure Generation

The measures of validity 595 may be calculated using the detection audio signal 235, the delayed audio signal 255 and the second detection audio signal 275 as discussed above. The value for the acoustic channel isolation $X_{I,log}(k)$ for each transform coefficient k as shown in expression 5 will be larger in typical applications because the correlation method is less sensitive to noise.

The alternate approach mentioned above may also be used. Its use is generally more suitable in this second implementation because the use of correlation scores rather than spectral magnitudes decreases sensitivity to ambient sounds. As explained above, the use of correlation scores allows the alternate approach to provide good results even if the overall transfer function of the acoustic output transducer 220, the acoustic channel through which the sound field 225 propagates, and the acoustic input transducer 230 cannot be represented accurately by a minimum phase filter with a possible time delay.

3. Non-feedback with Magnitude Comparison

The third exemplary implementation is similar to the first implementation described above. The differences in implementation arise from the fact the input to the delay 250 follows the AEQ filter 100 and, as a result, the response characteristics of this filter are not included in the system transfer function 375 that is derived in the analyzer 300.

a) Signal Analysis

The analyzer 300 in the second implementation is substantially the same as the analyzer 300 in the first implementation; however, the estimated spectral magnitude response correction signal 395 in this implementation represents an estimate of the desired frequency response of the AEQ filter 100 instead of a correction to that response.

The subtractor 370 subtracts the logarithmic values of the transform coefficients received from the log calculator 320b from the logarithmic values of the transform coefficients received from the log calculator 320a to calculate a representation of a system transfer function 375 in the log domain. Unlike the system transfer function 375 that is calculated in the first implementation, the system transfer function 375 that is calculated in this implementation does not include the response characteristics of the AEQ filter 100.

As a result, when the subtractor 390 subtracts the log values of the system transfer function 375 from the log values of the system target response 380, the resulting estimated correction signal 395 is an estimate of what the response characteristics of the AEQ filter 100 should be to obtain an overall system response that is equal to the system target response 380.

Similar to what is described above for the first implementation, the estimated spectral magnitude response correction signal 395 is accurate over long time intervals but it can vary significantly from block to block. As a result, the component values in the estimated correction signal 395 for any given block may differ significantly from the corrective values that should be provided to the AEQ filter 100. Preferably, a smoothing filter is applied to the estimated correction signal 395 to reduce or eliminate spurious variations. Smoothing is optional. In this exemplary implementation, a smoothing filter is applied in the control-signal generator 400.

b) Control Signal Generation

The control-signal generator 400 generates the equalization-filter control signal 495 that controls adaptation of the AEQ filter 100. In preferred implementations as mentioned above, the control-signal generator 400 derives the equalization-filter control signal 495 by applying a smoothing filter to the estimated correction signal 395 to reduce system sensitivity to noise. The control-signal generator 400 may also modify the values of selected components of the estimated correction signal 395 under conditions where the values of the selected components are deemed to be unreliable or invalid.

(1) Component Smoothing

Figure 7:
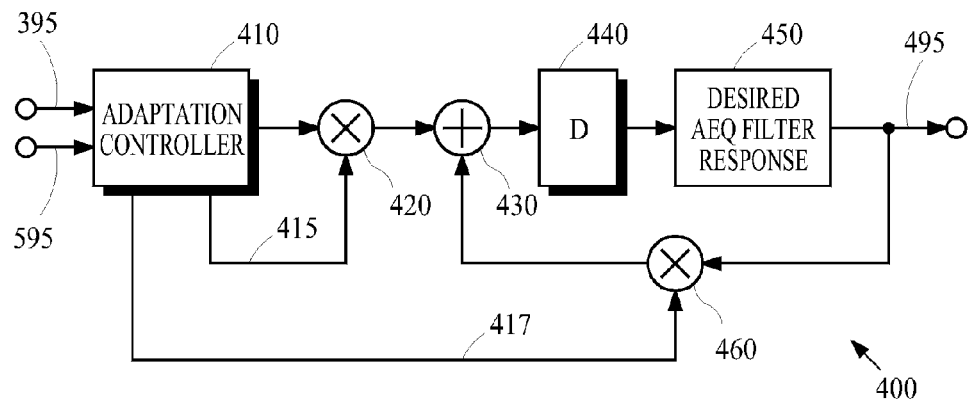

FIG. 7 illustrates one suitable implementation that includes a first-order smoothing filter in the form of a leaky integrator. Empirical tests have shown that a first order filter is adequate for many applications but higher order smoothing filters may be used if desired.

The implementation shown in FIG. 7 is similar to the implementation shown in FIG. 6 and discussed above. The implementation used here includes an additional vector multiplier 460 that is controlled by a second leak factor vector 417 provided by the adaptation controller 410. The vector multiplier 420 attenuates the magnitudes of the components in the current desired AEQ filter response 450 that are passed to the vector adder 430.

The vector multiplier 420 and the vector multiplier 460 implement a conventional first-order low pass filters in which the factors in the two correlation leak factor vectors are related to each other as shown above in expression 6.

The leak factor vector 415 may comprise factors with fixed values. If the leak factor vector 415 comprises factors with fixed values, these values may be chosen to provide a desired rate of adaptation of the AEQ filter 100 as described above.

c) Validity Measure Generation

The validity-measure generator 500 may be implemented as described above for the first implementation.

4. Non-feedback with Correlation Comparison

The fourth exemplary implementation shares features with the second and third implementations described above. The differences that are due to changes in the analysis performed in the analyzer 300 and in the control-signal generator 400 also apply to this fourth implementation.

5. AEQ Filter

The AEQ filter 100 may be essentially any type of filter structure including recursive, non-recursive and lattice structures provided it can adapt the magnitude of its frequency response according to the response characteristics specified by the equalization-filter control signal 495. For example, the AEQ filter 100 may be implemented by a bank of bandpass filters with overlapping or nearly overlapping passbands and respective gains for each bandpass filter. As another example, the AEQ filter 100 may operate according to a set of filter parameters selected from multiple sets of predefined parameters in which each set provides a particular frequency response. The set of parameters that provides the closest match to the response specified by the equalization-filter control signal 495 is selected. Another method derives appropriate filter parameters from the response characteristic specified by the equalization-filter control signal 495. Techniques that may be used to design sets of filter parameters for either method are discussed in international patent application publication no. WO 2010/014663 published Feb. 4, 2010.

One technique for a frequency-domain implementation is discussed below. This technique uses a block transform to implement the frequency-domain equivalent of convolving a block of signal samples with a finite impulse response. Essentially any time-domain to frequency-domain block transform and its inverse frequency-domain to time-domain block transform may be used. The transform length is denoted by the symbol N.

a) Static Filter

Figure 8:
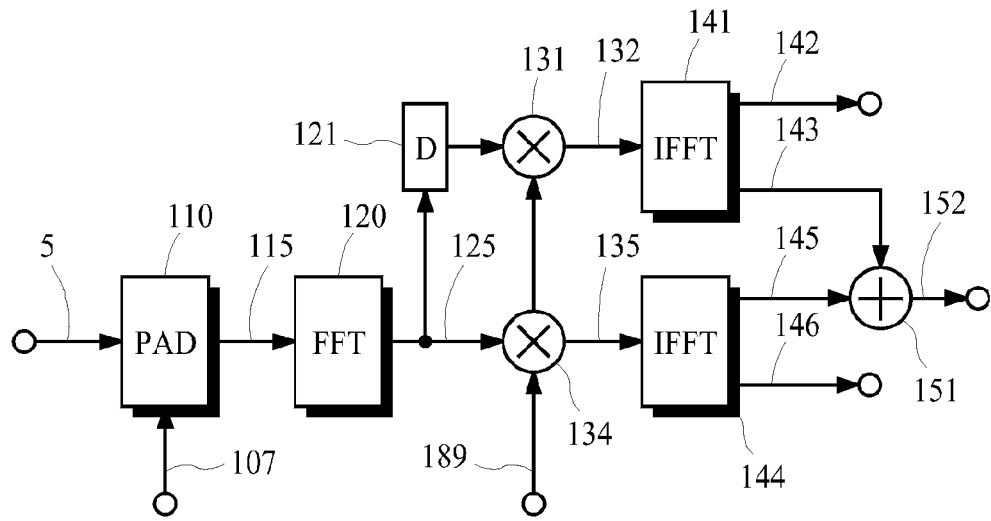
FIG. 8 is a schematic block diagram illustrating block operations for one implementation of a static equalization filter in the system of FIG. 1.
Figure 9:
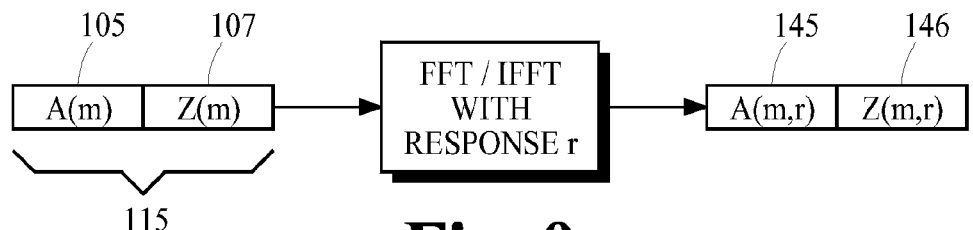
FIG. 9 is a schematic diagram of signal block structures.
Figure 10:
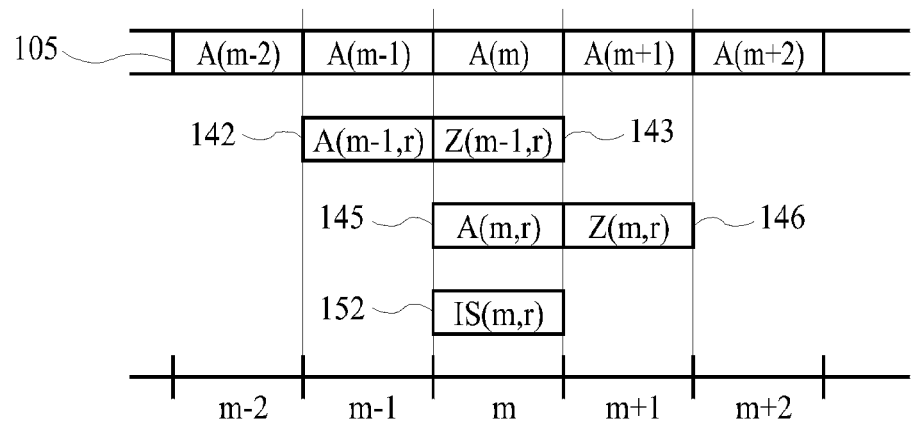
FIG. 10 is a schematic diagram of processing steps for the static filter shown in FIG. 8.

The basic operation of this filter implementation is illustrated by the schematic block diagrams in FIGS. 8 to 10. Referring to FIG. 8, the pad component 110 receives a segment 105 of N/2 samples for the audio signal 5 and appends it with a segment 107 of N/2 zero-valued samples to form a block 115 of N samples. The FFT 120 is applied to the block 115 of samples to generate a block 125 of N transform coefficients.

The vector multiplier 134 receives the block 125 of transform coefficients and a block 189 of values representing spectral magnitudes of a desired frequency response, and multiplies the magnitudes of the transform coefficients with respective values in the desired frequency response to generate a block 135 of filtered transform coefficients. The Inverse Fast Fourier Transform (IFFT) 144 is applied to the block 135 of filtered transform coefficients to generate a block of N time-domain signal samples. The first half of this block of time-domain samples contains a segment 145 of N/2 samples that represent the initial response of the FFT 120 to the samples in the block 115. The last half of the block of time-domain samples contains a segment 146 of N/2 samples that represent the ending response of the FFT 120 to the samples in the block 115.

The vector multiplier 131 receives a previous block 125 of transform coefficients through the delay 121 and a block 189 of values representing spectral magnitudes of a desired frequency response, and multiplies the magnitudes of the delayed transform coefficients with respective values in the desired frequency response to generate a block 132 of delayed filtered transform coefficients. The delay 121 imposes a delay equal to the interval of one segment. The IFFT 141 is applied to the block 132 of delayed filtered transform coefficients to generate a block of N time-domain signal samples. The first half of this block of time-domain samples contains a segment 142 of N/2 samples that represent the initial response of the FFT 120 to the samples in the previous block 115. The segment 142 is not used in this implementation. The last half of the block of time-domain samples contains a segment 143 of N/2 samples that represent the ending response of the FFT 120 to the samples in the previous block 115.

The overlap-add component 151 adds the samples in the segment 145 to the samples in the segment 143 and outputs the resulting sum as a segment 152 of N/2 samples. This segment is a portion of the filtered audio signal 195 when the frequency response of the AEQ filter 100 is static as is being described in these paragraphs.

The structures of some of the blocks and segments for this process are illustrated schematically in FIGS. 9 and 10. The samples in the segment 105 of N/2 audio signal samples are denoted by the symbol A(m), where m is a monotonically increasing block number. The block number increases by one for each subsequent block. The samples in the segment 107 of N/2 zero-valued samples are denoted by the symbol Z(m). The block of N time-domain signal samples generated by the IFFT comprises a segment of N/2 samples denoted by the symbol A(m,r) appended to a segment of N/2 samples denoted by the symbol Z(m,r), where r is an index for the filter frequency response. The samples A(m,r) represent the FFT's initial response to the samples in block m when the filter frequency response conforms to some response characteristic denoted by the index r. The samples Z(m,r) represent the FFT's ending response to the samples in block m when the filter frequency response conforms to the response characteristic r. The overlap-add component 151 adds respective samples Z(m−1,r) and A(m,r) to obtain a segment 152 of N/2 interim samples denoted as IS(m,r).

The index r in this notation does not change if the response characteristics of the filter are static. If the response characteristics of the filter are to be adapted, the index r will increase by one for each requested change. The filter response may change as often as every block by using the additional processes described below.

b) Adaptive Filter

Figure 11:
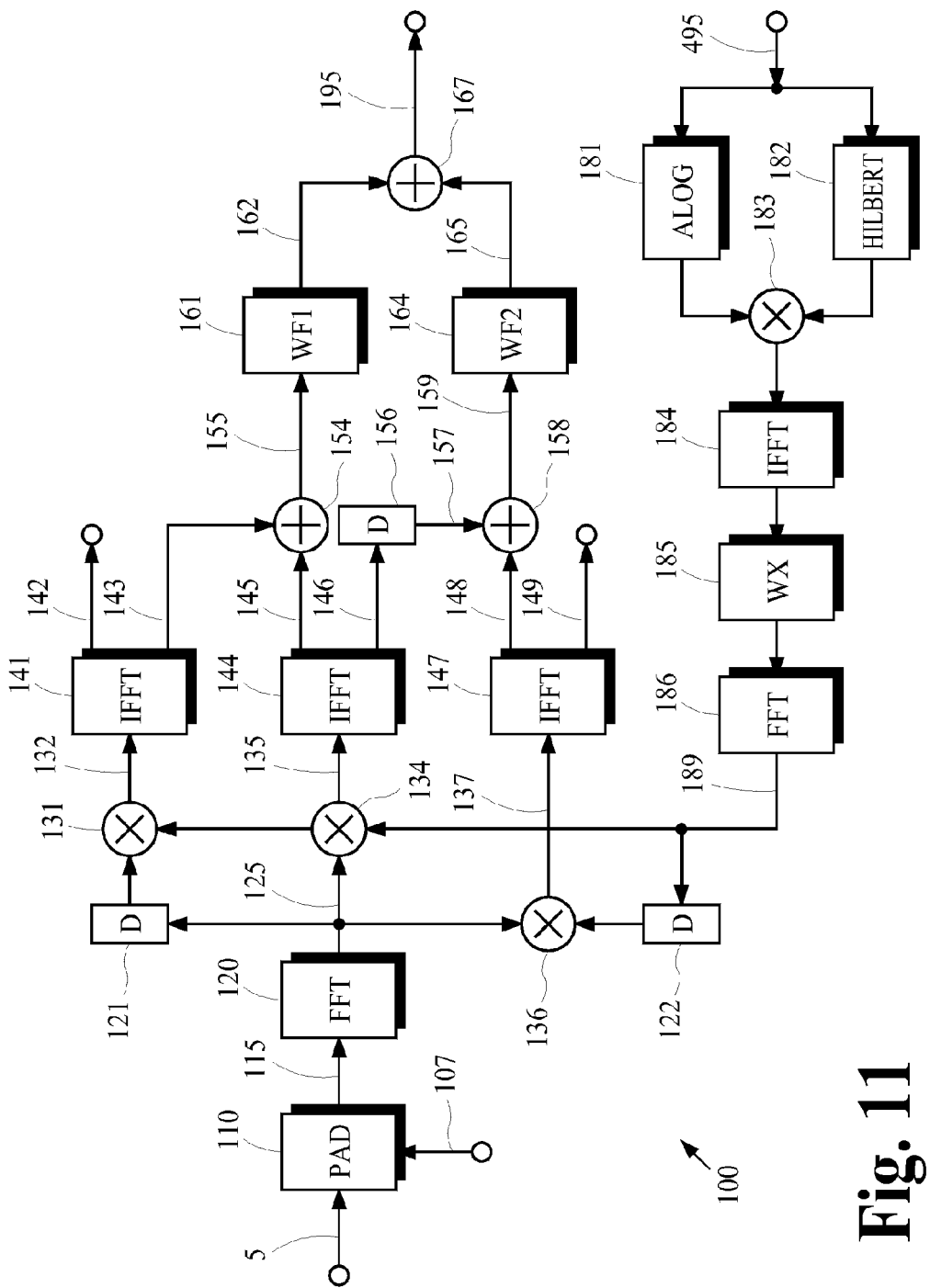
FIG. 11 is a schematic block diagram of one implementation of the adaptive equalization filter in the system of FIG. 1.
Figure 12:
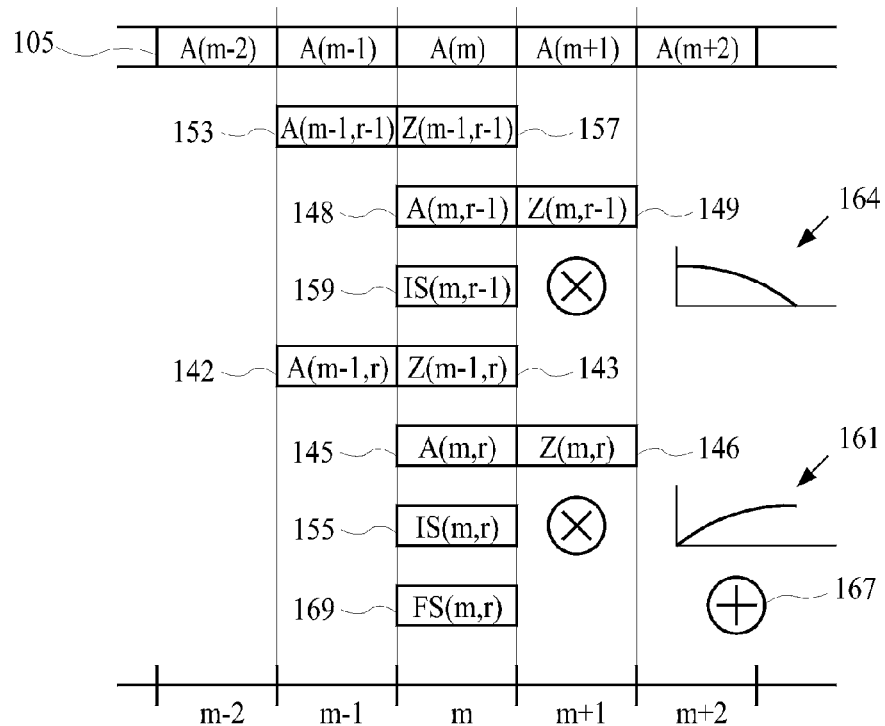
FIG. 12 is a schematic diagram of processing steps for the adaptive filter shown in FIG. 11.

FIG. 12 provides a schematic illustration of a sequence of processing steps that may be used to adapt the frequency response of the AEQ filter 100 when it is implemented as illustrated by the schematic block diagram in FIG. 11.

Referring to FIG. 12, each segment 105 of the audio signal 5 is processed as discussed above to generate a respective block of time-domain signal samples. Segments 153 and 157 are generated by processing the segment of samples A(m−1) with filter components adapted to conform to a desired frequency response represented by the index r−1. Segments 148 and 149 are generated by processing the segment of samples A(m) with filter components adapted to conform to the same frequency response r−1. Samples in the segment 157 are overlapped and added to samples in the segment 148 to obtain a segment 159 of interim samples IS(m,r−1). A windowing operation 164 using the last half of a window function WF is applied to the interim samples IS(m,r−1) in the segment 159. This last half of the window function is represented by the symbol WF2. A suitable window function WF2 is described below.

Segments 142 and 143 are generated by processing the segment of samples A(m−1) with filter components adapted to conform to a desired frequency response represented by the index r. Segments 145 and 146 are generated by processing the segment of samples A(m) with filter components adapted to conform to the same frequency response r. Samples in the segment 143 are overlapped and added to samples in the segment 145 to obtain a segment 155 of interim samples IS(m,r). A windowing operation 161 using the first half of the window function WF is applied to the interim samples IS(m,r) in the segment 155. This first half of the window function is represented by the symbol WF1.

The samples in the two window-weighed segments are overlapped and added to obtain a segment 169 of N/2 samples in the filtered audio signal 195.

Preferably, the half-window functions WF1 and WF2 add to one when overlapped with one another, and provide good frequency selectivity and stop-band rejection. Suitable window functions WF1 and WF2 are defined by the following expressions:

$$WF1(n) = \frac{\left[\sum_{p=0}^{n}\left[W^{\frac{N}{2}+1}_{Kaiser,\alpha=\frac{10}{\pi}}(p)\right]\right]}{\left[\sum_{p=0}^{\frac{n}{2}}\left[W^{\frac{N}{2}+1}_{Kaiser,\alpha=\frac{10}{\pi}}(p)\right]\right]} \text{ for } 0 \le n < \frac{N}{2} \quad (13)$$

$$WF2(n) = WF1\left(\frac{N}{2} - n - 1\right) \text{ for } 0 \le n < \frac{N}{2} \quad (14)$$

where $$W^{\frac{N}{2}+1}_{Kaiser,\alpha=\frac{10}{\pi}}(n) = \frac{I_0\left[\pi\alpha\sqrt{1.0 - \left(\frac{n-\frac{N}{4}}{\frac{N}{4}}\right)^2}\right]}{I_0[\pi\alpha]} \text{ for } 0 \le n \le \frac{N}{2} \text{ and } \alpha = \frac{10}{\pi}.$$

Additional details about the window function derived from the Kaiser-Bessel kernel function may be obtained from U.S. Pat. No. 5,222,189 issued Jun. 22, 1993.

FIG. 11 is a schematic block diagram of a device that may be used to perform the process just described. This diagram is not intended to illustrate a practical implementation. For example, some of the FFT and IFFT components can be eliminated by using buffers to store time-domain samples calculated for previous segments of samples.

The components illustrated in FIG. 11 that correspond to components shown in FIG. 8 have the same reference numbers and operate as described above.

The vector multiplier 136 receives the block 125 of transform coefficients and a block 189 of values delayed by an interval of one segment representing spectral magnitudes of a previous desired frequency response, and multiplies the magnitudes of the transform coefficients with respective values in the previous desired frequency response to generate a block 137 of filtered transform coefficients. The IFFT 147 is applied to the block 137 of filtered transform coefficients to generate a block of N time-domain signal samples. The first half of this block of time-domain samples contains a segment 148 of N/2 samples that represent the initial response of the FFT 120 to the samples in the block 115. The last half of the block of time-domain samples contains a segment 149 of N/2 samples that represent the ending response of the FFT 120 to the samples in the block 115. The segment 149 is not used in this implementation.

The overlap-add component 154 adds the samples in the segment 145 to the samples in the segment 143 and outputs the resulting sum as a segment 155 of N/2 samples. A windowing operation 161 is applied to the samples in the segment 155 using the first half of the windowing function WF to generate a segment 162 of N/2 windowed samples. The first half of this function is represented by the symbol WF1.

The delay 156 imposes a delay of one segment interval to the segment 146 to generate a segment 157 of N/2 delayed samples. The overlap-add component 158 adds the samples in the segment 148 to the delayed samples in the segment 157 and outputs the resulting sum as a segment 159 of N/2 samples. A windowing operation 164 is applied to the samples in the segment 159 using the last half of the windowing function WF to generate a segment 165 of N/2 windowed samples. The last half of this function is represented by the symbol WF2.

The vector adder 167 overlaps and adds corresponding samples in the segments 162 and 165 to generate a segment 169 of N/2 samples in the filtered audio signal 195.

The remaining components 181 to 186 shown in the drawing are applied to the equalization-filter control signal 495 to generate the blocks 189 of values representing spectral magnitudes of desired frequency responses.

The antilog 181 generates linear-domain magnitudes of the components in the equalization-filter control signal 495. The Hilbert transform 182 is applied to the log magnitude values of the equalization-filter control signal 495 to generate a set of angular coefficients. The vector multiplier 183 multiplies each components of the linear-domain magnitudes with a respective angular coefficient to generate a set of complex-valued coefficients in a frequency-domain representation of a minimum-phase causal impulse response that has the same frequency response as that specified in the equalization-filter control signal 495. Additional details of this process may be obtained from Oppenhiem et al., *Digital Signal Processing*, Prentice Hall Inc., 1975, pp 337-361

The IFFT 184 is applied to the set of coefficients in the frequency-domain representation of the minimum-phase causal impulse response to obtain a time-domain representation of this impulse response. A windowing operation 185 is applied to this time-domain impulse response to ensure no more than the first N/2+1 samples have non-zero values. The limitation on the length of the impulse response and the zero-padding of the input audio samples mentioned above prevent circular convolution distortions. Additional details may be obtained from Oppenhiem et al., *Digital Signal Processing*, Prentice Hall Inc., 1975, pp 113-115.

Essentially any smoothly-varying window function with a length no greater than N/2+1 may be used. Window functions with abrupt variations are not desirable because their use will introduce audible artifacts into the derived frequency response.

The following window function WX may be used:

$$WX(n) = \begin{cases} 1 & \text{for } 0 \leq n < \frac{N}{4} \\ W^{\frac{N}{2}+1}_{Kaiser, \alpha=\frac{10}{\pi}}(n) & \text{for } \frac{N}{4} \leq n \leq \frac{N}{2} \\ 0 & \text{for } \frac{N}{2}+1 \leq n < N \end{cases} \quad (15)$$

Zero-valued samples are appended to the windowed impulse response to obtain a block of N samples. The FFT 186 is applied to the windowed and appended impulse response to generate a block 189 of values representing spectral magnitudes of the desired frequency response that is specified by the equalization-filter control signal 495.

C. Alternative Implementations

A few alternative implementations are discussed below.

1. Alternative Transform

The filtering operations that are performed in the AEQ filter 100 and the analyzer 300 may be implemented by essentially any filtering technology that may be desired. The four exemplary implementations discussed above use the FFT and IFFT computational methods to implement DFT and IDFT filterbanks. An alternative implementation described here uses the FFT and IFFT computational methods to implement MDFT and IDFT filterbanks. The MDFT filterbank generates blocks of transform coefficients according to the following expression:

$$X(k) = \sum_{n=0}^{N-1} x(n) \cdot e^{\frac{-2\pi j(k+\frac{1}{2})n}{N}} \quad \text{for } 0 \leq k < N \quad (16a)$$

The first N/2 transform coefficients X(k) in each block are unique and have complex values.

The complementary IMDFT filterbank generates blocks of time-domain samples according to the following expression:

$$x(n) = \frac{1}{N} \sum_{k=0}^{N-1} X(k) \cdot e^{\frac{2\pi j(k+\frac{1}{2})n}{N}} \quad \text{for } 0 \leq k < N. \quad (16b)$$

A pair of windowing operations are used with these filterbanks. One windowing operation applies an analysis window function to the audio signal prior to an analysis or forward transform. Another windowing operation applies a synthesis window function to blocks of time-domain samples generated by a synthesis or inverse transform. Essentially any window functions may be used but the analysis and synthesis window functions should be designed so that their product window, when overlapped with itself by half its length, adds to one. One exemplary function that may be used for each of the analysis and window functions is the sine function with its domain scaled so that zero to pi radians corresponds to 0 to N−1 samples.

The implementation discussed below uses a window function WQ for the analysis window function and uses its respective half-window functions WQ1, WQ2 for synthesis window functions as shown in the following expressions:

$$WQ(n) = \sqrt{WF(n)} \quad (17)$$

$$= \begin{cases} \sqrt{WF1(n)} & \text{for } 0 \leq n < \frac{N}{2} \\ \sqrt{WF2\left(n - \frac{N}{2}\right)} & \text{for } \frac{N}{2} \leq n < N \end{cases}$$

$$WQ1(n) = \sqrt{WF1(n)} \quad (18)$$

$$= \frac{\sum_{p=0}^{n} \left[W^{\frac{N}{2}+1}_{Kaiser, \alpha=\frac{10}{\pi}}(p)\right]}{\sum_{p=0}^{\frac{n}{2}} \left[W^{\frac{N}{2}+1}_{Kaiser, \alpha=\frac{10}{\pi}}(p)\right]} \quad \text{for } 0 \leq n < \frac{N}{2}$$

$$WQ2(n) = \sqrt{WF2(n)} \quad (19)$$

$$= \sqrt{WF1\left(\frac{N}{2} - n - 1\right)} \quad \text{for } 0 \leq n < \frac{n}{2}$$

Figure 13:
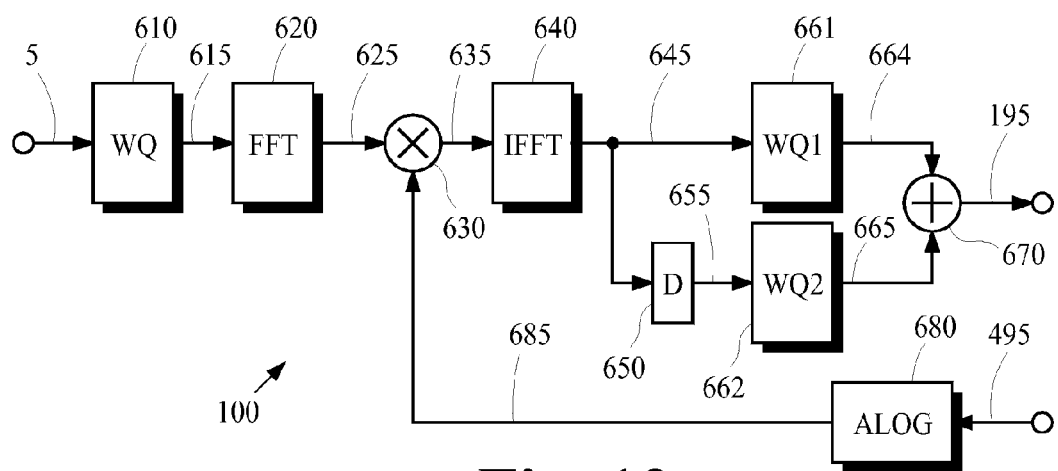
FIG. 13 is a schematic block diagram of an alternative implementation of the adaptive equalization filter in the system of FIG. 1.

One implementation of the AEQ filter 100 that uses these filterbanks is illustrated by the schematic block diagram in FIG. 13. A windowing operation 610 applies the window function WQ to a block of N samples of the audio signal 5 to generate a block 615 of N window-weighted samples. The FFT 620 is applied to the block 615 of window-weighted samples to generate a block 625 of N transform coefficients.

The vector multiplier 630 receives the block 625 of transform coefficients and a block 685 of values representing spectral magnitudes of a desired frequency response, and multiplies the magnitudes of the transform coefficients with respective values in the desired frequency response to generate a block 635 of filtered transform coefficients. The Inverse Fast Fourier Transform (IFFT) 640 is applied to the block 635 of filtered transform coefficients to generate a block 645 of N time-domain signal samples.

A sequence of the blocks 645 of time-domain samples are each weighted by the window function WQ, overlapped with one another by N/2 samples, and corresponding samples in overlapped blocks are added. This windowing-overlap-add process may be performed in a variety of ways. One way is illustrated in the figure.

In this implementation, the delay 650 imposes a delay of N/2 samples on a block 645 of time-domain samples to generate a delayed block 655 of time-domain samples. The windowing operation 661 applies the first half WQ1 of the window function WQ to the first half of the block 645 of time-domain samples to generate a segment 664 of N/2 windowed time-domain samples. The windowing operation 662 applies the last half WQ2 of the window function WQ to the last half of the delayed block 655 of time-domain samples to generate a delayed segment 665 of N/2 windowed time-domain samples. The overlap-add component 670 adds corresponding samples in the segment 664 of windowed time-domain samples and the delayed segment 665 of windowed time-domain samples and outputs the resulting sums as a segment of N/2 time-domain samples in the filtered audio signal 195.

The antilog 680 is applied to the components in the equalization-filter control signal 495 to generate a block 189 of values in the linear-domain that represent spectral magnitudes of the desired frequency response that is specified by the equalization-filter control signal 495.

2. Alternative Delayed Signal

An alternative implementation of the analyzer 300 omits the filterbank 310b and receives a frequency-domain representation of the delayed audio signal directly from the delay 250. This may be achieved by obtaining a frequency-domain representation of the audio signal 5 from the AEQ filter 100 and passing this representation to the delay 250.

The amount of delay that can be imposed by the delay 250 in this implementation is equal to the interval of an integer number of segments, where each segment has N/2 samples. If desired, greater accuracy in the temporal alignment between the delayed audio signal 255 and the detection audio signal 235 may be achieved by ensuring the delay imposed by the delay 250 is greater than what is required to achieve proper alignment and introducing an additional delay somewhere in the signal path between the acoustic input transducer 230 and the filterbank 310a. The additional delay can be implemented using either analog or digital techniques to obtain the desired temporal alignment.

3. Alternative Transform Length

The spectral resolution of the AEQ filter 100 should be high enough to provide good equalization for the most demanding system transfer function it is likely to encounter. This spectral resolution is determined by the length N of the FFT 620 and the shape of the analysis window function used in the windowing operation 610. For a given analysis window function, spectral resolution increases as the transform length increases.

Signal processing delays in the AEQ filter 100 also increase as the transform length increases. The technique discussed below provides a way to decrease processing delays for a given transform length.

In one implementation, the window function WQ is set to 180 samples. The windowing operation 610 generates sample blocks 615 having a length equal to 256 that each comprise 76 zero-valued samples appended to 180 window-weighted samples of the audio signal 5. The FFT 620 and the IFFT 640 each have a length equal to 256. The IFFT 640 generates blocks 645 each having 256 time-domain samples. The last 76 samples in each block can be ignored. The windowing operation 661 is applied to the first half of the first 180 samples in each block and the window operation 662 is applied to the last half of the first 180 samples in the block.

The overlap-add component 670 adds corresponding samples in the segment 664 of windowed time-domain samples and the delayed segment 665 of windowed time-domain samples and outputs the resulting sums as a segment of 90 time-domain samples in the filtered audio signal 195.

D. Implementation

Figure 14:
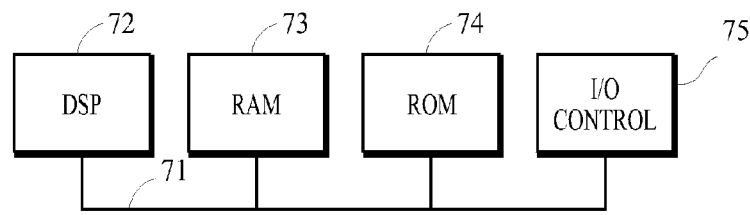
FIG. 14 is a schematic block diagram of a device that may be used to implement various aspects of the present invention.

Devices that incorporate various aspects of the present invention may be implemented in a variety of ways including software for execution by a computer or some other device that includes more specialized components such as digital signal processor (DSP) circuitry coupled to components similar to those found in a general-purpose computer. FIG. 14 is a schematic block diagram of a device 70 that may be used to implement aspects of the present invention. The processor (PROC) 72 provides computing resources. RAM 73 is system random access memory (RAM) used by the PROC 72 for processing. ROM 74 represents some form of persistent storage such as read only memory (ROM) for storing programs needed to operate the device 70 and possibly for carrying out various aspects of the present invention. I/O control 75 represents interface circuitry to receive and transmit signals such as the signals 5, 195, 235, 255, 275 and 495 mentioned above. In the embodiment shown, all major system components connect to the bus 71, which may represent more than one physical or logical bus; however, a bus architecture is not required to implement the present invention.

In embodiments implemented by a general purpose computer system, additional components may be included for interfacing to devices such as a keyboard or mouse and a display, and for controlling a storage device 78 having a storage medium such as magnetic tape or disk, or an optical medium. The storage medium may be used to record programs of instructions for operating systems, utilities and applications, and may include programs that implement various aspects of the present invention.

The functions required to practice various aspects of the present invention can be performed by components that are implemented in a wide variety of ways including discrete logic components, integrated circuits, one or more ASICs and/or program-controlled processors. The manner in which these components are implemented is not important to the present invention.

Software implementations of the present invention may be conveyed by a variety of machine readable media such as baseband or modulated communication paths throughout the spectrum including from supersonic to ultraviolet frequencies, or storage media that convey information using essentially any recording technology including magnetic tape, cards or disk, optical cards or disc, and detectable markings on media including paper.

What is claimed is:

1. A method for equalizing an audio signal, wherein the method comprises:
   receiving the audio signal;
   applying an adaptive filter to the audio signal to generate a filtered audio signal;
   driving an acoustic output transducer with the filtered audio signal to generate a sound field;
   generating a detection audio signal by detecting the sound field after propagating through an acoustic channel with an acoustic input transducer;
   obtaining a first frequency-domain representation from the detection audio signal that is a composite spectral magnitude response of the acoustic output transducer, the acoustic channel and the acoustic input transducer;
   applying a delay to the filtered audio signal to obtain a delayed filtered audio signal, wherein the delay includes an approximation of propagation delays of the sound field through the acoustic channel;
   obtaining a second frequency-domain representation from the delayed filtered audio signal;
   processing the first frequency-domain representation, the second frequency-domain representation, and a third frequency-domain representation from spectral components of a target spectral magnitude response to generate an estimated spectral magnitude response correction signal;
   obtaining an equalization-filter control signal from the estimated spectral magnitude response correction signal; and
   configuring adapting filter characteristics of the adaptive filter in response to the equalization-filter control signal.

2. The method of claim 1, wherein the estimated spectral magnitude response correction signal is the equalization-filter control signal.

3. The method of claim 1 that comprises applying a smoothing filter to a sequence of the estimated spectral magnitude response correction signal and one or more previous estimated spectral magnitude response correction signals to generate the equalization-filter control signal.

4. The method of claim 1, wherein the first frequency-domain representation comprises values representing magnitudes of the spectral components of the composite spectral magnitude response, and wherein the second frequency-domain representation comprises values representing magnitudes of the spectral components of the delayed audio signal.

5. The method of claim 1, wherein:
the first frequency-domain representation is obtained from a cross correlation of spectral components of the composite spectral magnitude response and spectral components of the delayed audio signal; and
the second frequency-domain representation is obtained from spectral components of an auto correlation of the delayed filtered audio signal.

6. The method of claim 1 that comprises checking validity of:
generating a second detection audio signal by detecting the sound field and any ambient sounds with a second acoustic input transducer;
comparing signal levels or spectral characteristics of the delayed audio signal, the detection audio signal and the second detection audio signal to generate measures of validity associated with spectral components of the estimated spectral magnitude response correction signal; and
modifying magnitudes of one or more of the spectral components of the estimated spectral magnitude response correction signal in response to associated measures of validity to reduce responsiveness of configuring of the adaptive filter to those spectral components having lower measures of validity.

7. A method for applying an equalization filter to an audio signal represented by samples, wherein the method comprises:
(a) appending a segment of zero-valued samples to segments of audio signal samples in a sequence of segments to obtain a sequence of blocks of samples, each block of samples having a first half with audio signal samples and a second half with zero-valued samples;
(b) configuring the equalization filter to have a first frequency-response characteristic in response to an equalization-filter control signal;
(c) applying the equalization filter with the first frequency-response characteristic to a first block of samples in the sequence of blocks of samples to obtain a first filtered block of spectral components having a first half and a second half, wherein
 (1) the first half of the first filtered block represents application of the equalization filter to the first half of the first block of samples and includes convolution products, and
 (2) the second half of the first filtered block represents application of the equalization filter to the second half of the first block of samples and includes convolution products;
(d) applying the equalization filter with the first frequency-response characteristic to a second block of samples that follows the first block of samples in the sequence of blocks of samples to obtain a second filtered block of spectral components having a first half and a second half, wherein
 (1) the first half of the second filtered block represents application of the equalization filter to the first half of the second block of samples and includes convolution products, and
 (2) the second half of the second filtered block represents application of the equalization filter to the second half of the second block of samples and includes convolution products;
(e) combining the second half of the first filtered block with the first half of the second filtered block and applying a first half of a window function to obtain a first windowed block, wherein the window function has a first half and a second half and the second half follows the first half;
(f) configuring the equalization filter to have a second frequency-response characteristic in response to an equalization-filter control signal;
(g) applying the equalization filter with the second frequency-response characteristic to the first block of samples in the sequence of blocks of samples to obtain a third filtered block of spectral components having a first half and a second half, wherein
 (1) the first half of the third filtered block represents application of the equalization filter to the first half of the first block of samples and includes convolution products, and
 (2) the second half of the third filtered block represents application of the equalization filter to the second half of the first block of samples and includes convolution products;
(h) applying the equalization filter with the second frequency-response characteristic to the second block of samples that follows the first block of samples in the sequence of blocks of samples to obtain a fourth filtered block of spectral components having a first half and a second half, wherein
 (1) the first half of the fourth filtered block represents application of the equalization filter to the first half of the second block of samples and includes convolution products, and
 (2) the second half of the fourth filtered block represents application of the equalization filter to the second half of the second block of samples and includes convolution products;
(i) combining the second half of the third filtered block with the first half of the fourth filtered block and applying the second half of the window function to obtain a second windowed block; and
(j) combining the first windowed block with the second windowed block to obtain an output block representing a transition in frequency response of filtering applied to the second segment of audio signal samples from the first frequency-response characteristic to the second frequency-response characteristic.

8. The method claim 7, wherein the first half of the window function and the second half of the window function add to one when overlapped with one another.

9. The method of claim 1 that comprises applying the adaptive filter to the audio signal and configuring the adaptive filter to the equalization-filter control signal by performing the method of claim 7.

10. An apparatus for equalizing an audio signal, wherein the apparatus comprises:
  means for receiving the audio signal;
  means for applying an adaptive filter to the audio signal to generate a filtered audio signal;
  means for driving an acoustic output transducer with the filtered audio signal to generate a sound field;
  means for generating a detection audio signal by detecting the sound field after propagating through an acoustic channel with an acoustic input transducer;
  means for obtaining a first frequency-domain representation from the detection audio signal that is a composite spectral magnitude response of the acoustic output transducer, the acoustic channel and the acoustic input transducer;
  means for applying a delay to the filtered audio signal to obtain a delayed filtered audio signal, wherein the delay includes an approximation of propagation delays of the sound field through the acoustic channel;
  means for obtaining a second frequency-domain representation from the delayed filtered audio signal;
  means for processing the first frequency-domain representation, the second frequency-domain representation, and a third frequency-domain representation from spectral components of a target spectral magnitude response to generate an estimated spectral magnitude response correction signal;
  means for obtaining an equalization-filter control signal from the estimated spectral magnitude response correction signal; and
  means for configuring filter characteristics of the adaptive filter in response to the equalization-filter control signal.

11. The apparatus of claim 10, wherein the estimated spectral magnitude response correction signal is the equalization-filter control signal.

12. The apparatus of claim 10 that comprises means for applying a smoothing filter to a sequence of the estimated spectral magnitude response correction signal and one or more previous estimated spectral magnitude response correction signals to generate the equalization-filter control signal.

13. The apparatus of claim 10, wherein:
  the first frequency-domain representation is obtained from a cross correlation of spectral components of the composite spectral magnitude response and spectral components of the delayed audio signal; and
  the second frequency-domain representation is obtained from spectral components of an auto correlation of the delayed filtered audio signal.

14. The apparatus of claim 10 that comprises means for checking validity of:
  generating a second detection audio signal by detecting the sound field and any ambient sounds with a second acoustic input transducer;
  comparing signal levels or spectral characteristics of the delayed audio signal, the detection audio signal and the second detection audio signal to generate measures of validity associated with spectral components of the estimated spectral magnitude response correction signal; and
  modifying magnitudes of one or more of the spectral components of the estimated spectral magnitude response correction signal in response to associated measures of validity to reduce responsiveness of adaptation of the adaptive filter to those spectral components having lower measures of validity.

15. An apparatus for applying an equalization filter to an audio signal represented by samples, wherein the method comprises:
  (a) means for appending a segment of zero-valued samples to segments of audio signal samples in a sequence of segments to obtain a sequence of blocks of samples, each block of samples having a first half with audio signal samples and a second half with zero-valued samples;
  (b) means for configuring the equalization filter to have a first frequency-response characteristic in response to an equalization-filter control signal;
  (c) means for applying the equalization filter with the first frequency-response characteristic to a first block of samples in the sequence of blocks of samples to obtain a first filtered block of spectral components having a first half and a second half, wherein
    (1) the first half of the first filtered block represents application of the equalization filter to the first half of the first block of samples and includes convolution products, and
    (2) the second half of the first filtered block represents application of the equalization filter to the second half of the first block of samples and includes convolution products;
  (d) means for applying the equalization filter with the first frequency-response characteristic to a second block of samples that follows the first block of samples in the sequence of blocks of samples to obtain a second filtered block of spectral components having a first half and a second half, wherein
    (1) the first half of the second filtered block represents application of the equalization filter to the first half of the second block of samples and includes convolution products, and
    (2) the second half of the second filtered block represents application of the equalization filter to the second half of the second block of samples and includes convolution products;
  (e) means for combining the second half of the first filtered block with the first half of the second filtered block and applying a first half of a window function to obtain a first windowed block, wherein the window function has a first half and a second half and the second half follows the first half;
  (f) means for configuring the equalization filter to have a second frequency-response characteristic in response to an equalization-filter control signal;
  (g) means for applying the equalization filter with the second frequency-response characteristic to the first block of samples in the sequence of blocks of samples to obtain a third filtered block of spectral components having a first half and a second half, wherein
    (1) the first half of the third filtered block represents application of the equalization filter to the first half of the first block of samples and includes convolution products, and
    (2) the second half of the third filtered block represents application of the equalization filter to the second half of the first block of samples and includes convolution products;
  (h) means for applying the equalization filter with the second frequency-response characteristic to the second block of samples that follows the first block of samples in the sequence of blocks of samples to obtain a fourth filtered block of spectral components having a first half and a second half, wherein (1) the first half of the fourth filtered block represents application of the equalization filter to the first half of the second block of samples and includes convolution products, and (2) the second half of the fourth filtered block represents application of the equalization filter to the second half of the second block of samples and includes convolution products;

(i) means for combining the second half of the third filtered block with the first half of the fourth filtered block and applying the second half of the window function to obtain a second windowed block; and (j) means for combining the first windowed block with the second windowed block to obtain an output block representing a transition in frequency response of filtering applied to the second segment of audio signal samples from the first frequency-response characteristic to the second frequency-response characteristic.

16. A non-transitory medium recording a program of instructions that is executed by a device to perform a method for equalizing an audio signal, wherein the method comprises:

receiving the audio signal;

applying an adaptive filter to the audio signal to generate a filtered audio signal;

driving an acoustic output transducer with the filtered audio signal to generate a sound field;

generating a detection audio signal by detecting the sound field after propagating through an acoustic channel with an acoustic input transducer;

obtaining a first frequency-domain representation from the detection audio signal that is a composite spectral magnitude response of the acoustic output transducer, the acoustic channel and the acoustic input transducer;

applying a delay to the filtered audio signal to obtain a delayed filtered audio signal, wherein the delay includes an approximation of propagation delays of the sound field through the acoustic channel;

obtaining a second frequency-domain representation from the delayed filtered audio signal;

processing the first frequency-domain representation, the second frequency-domain representation, and a third frequency-domain representation from spectral components of a target spectral magnitude response to generate an estimated spectral magnitude response correction signal;

obtaining an equalization-filter control signal from the estimated spectral magnitude response correction signal; and configuring filter characteristics of the adaptive filter in response to the equalization-filter control signal.

17. The medium of claim 16, wherein the method comprises applying a smoothing filter to a sequence of the estimated spectral magnitude response correction signal and one or more previous estimated spectral magnitude response correction signals to generate the equalization-filter control signal.

18. The medium of claim 16, wherein:

the first frequency-domain representation is obtained from a cross correlation of spectral components of the composite spectral magnitude response and spectral components of the delayed audio signal; and the second frequency-domain representation is obtained from spectral components of an auto correlation of the delayed filtered audio signal.

19. The medium of claim 16, wherein the method comprises checking validity of:

generating a second detection audio signal by detecting the sound field and any ambient sounds with a second acoustic input transducer;

comparing signal levels or spectral characteristics of the delayed audio signal, the detection audio signal and the second detection audio signal to generate measures of validity associated with spectral components of the estimated spectral magnitude response correction signal; and modifying magnitudes of one or more of the spectral components of the estimated spectral magnitude response correction signal in response to associated measures of validity to reduce responsiveness of configuration of the adaptive filter to those spectral components having lower measures of validity.

20. A non-transitory medium recording a program of instructions that is executed by a device to perform a method for applying an equalization filter to an audio signal represented by samples, wherein the method comprises:

(a) appending a segment of zero-valued samples to segments of audio signal samples in a sequence of segments to obtain a sequence of blocks of samples, each block of samples having a first half with audio signal samples and a second half with zero-valued samples;

(b) configuring the equalization filter to have a first frequency-response characteristic in response to an equalization-filter control signal;

(c) applying the equalization filter with the first frequency-response characteristic to a first block of samples in the sequence of blocks of samples to obtain a first filtered block of spectral components having a first half and a second half, wherein (1) the first half of the first filtered block represents application of the equalization filter to the first half of the first block of samples and includes convolution products, and (2) the second half of the first filtered block represents application of the equalization filter to the second half of the first block of samples and includes convolution products;

(d) applying the equalization filter with the first frequency-response characteristic to a second block of samples that follows the first block of samples in the sequence of blocks of samples to obtain a second filtered block of spectral components having a first half and a second half, wherein (1) the first half of the second filtered block represents application of the equalization filter to the first half of the second block of samples and includes convolution products, and (2) the second half of the second filtered block represents application of the equalization filter to the second half of the second block of samples and includes convolution products;

(e) combining the second half of the first filtered block with the first half of the second filtered block and applying a first half of a window function to obtain a first windowed block, wherein the window function has a first half and a second half and the second half follows the first half;

(f) configuring the equalization filter to have a second frequency-response characteristic in response to an equalization-filter control signal;

(g) applying the equalization filter with the second frequency-response characteristic to the first block of samples in the sequence of blocks of samples to obtain a third filtered block of spectral components having a first half and a second half, wherein (1) the first half of the third filtered block represents application of the equalization filter to the first half of the first block of samples and includes convolution products, and (2) the second half of the third filtered block represents application of the equalization filter to the second half of the first block of samples and includes convolution products;

(h) applying the equalization filter with the second frequency-response characteristic to the second block of samples that follows the first block of samples in the sequence of blocks of samples to obtain a fourth filtered block of spectral components having a first half and a second half, wherein (1) the first half of the fourth filtered block represents application of the equalization filter to the first half of the second block of samples and includes convolution products, and (2) the second half of the fourth filtered block represents application of the equalization filter to the second half of the second block of samples and includes convolution products;

(i) combining the second half of the third filtered block with the first half of the fourth filtered block and applying the second half of the window function to obtain a second windowed block; and (j) combining the first windowed block with the second windowed block to obtain an output block representing a transition in frequency response of filtering applied to the second segment of audio signal samples from the first frequency-response characteristic to the second frequency-response characteristic.

\* \* \* \* \*